United States Patent
Gui et al.

(10) Patent No.: US 12,238,918 B1
(45) Date of Patent: Feb. 25, 2025

(54) SEMICONDUCTOR DEVICE, MANUFACTURING METHOD THEREFOR, AND ELECTRONIC DEVICE

(71) Applicant: BEIJING SUPERSTRING ACADEMY OF MEMORY TECHNOLOGY, Beijing (CN)

(72) Inventors: Wenhua Gui, Beijing (CN); Xuezheng Ai, Beijing (CN); Guilei Wang, Beijing (CN); Jin Dai, Beijing (CN); Xiangsheng Wang, Beijing (CN)

(73) Assignee: BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 0 days.

(21) Appl. No.: 18/754,418

(22) Filed: Jun. 26, 2024

Related U.S. Application Data

(63) Continuation of application No. PCT/CN2024/076732, filed on Feb. 7, 2024.

(30) Foreign Application Priority Data

Aug. 10, 2023 (CN) .......................... 202311000832.9

(51) Int. Cl.
H10B 12/00 (2023.01)
(52) U.S. Cl.
CPC ............. *H10B 12/30* (2023.02); *H10B 12/03* (2023.02); *H10B 12/05* (2023.02)
(58) Field of Classification Search
CPC ........ H10B 12/03; H10B 12/05; H10B 12/30; H10B 12/033; H10B 12/0335
See application file for complete search history.

(56) References Cited

U.S. PATENT DOCUMENTS

2019/0074277 A1* 3/2019 Ramaswamy ........ G11C 11/221
2020/0043941 A1 2/2020 Kim et al.
(Continued)

FOREIGN PATENT DOCUMENTS

| CN | 115988875 A | 4/2023 |
| CN | 115996570 A | 4/2023 |

(Continued)

OTHER PUBLICATIONS

CNIPA First Office Action in CN Application No. 2023110008329 dated Sep. 9, 2023 (16 pages, including English translation).

*Primary Examiner* — Michelle Mandala
*Assistant Examiner* — Kevin Quinto
(74) *Attorney, Agent, or Firm* — Brooks Kushman, P.C.

(57) ABSTRACT

Provided are a semiconductor device and manufacturing method thereof, and an electronic device. The semiconductor device includes multiple storage cells distributed in a direction perpendicular to a base substrate, the multiple storage cells include multiple transistors and capacitors distributed in different layers and stacked in the direction perpendicular to the base substrate; a word line penetrating different layers and extending in the direction perpendicular to the base substrate; a transistor includes a first source/drain electrode, a second source/drain electrode and a semiconductor layer surrounding a sidewall of the word line; first insulating layers and conductive layers alternately distributed in the direction perpendicular to the base substrate, at least one first hole penetrating the different layers; and the second electrode of the capacitor includes an inner electrode disposed in the first hole on the first electrode.

20 Claims, 20 Drawing Sheets

(56) References Cited

U.S. PATENT DOCUMENTS

| | | |
|---|---|---|
| 2021/0257370 A1 | 8/2021 | Son |
| 2022/0199627 A1 | 6/2022 | Fishburn et al. |
| 2022/0344339 A1 | 10/2022 | Varghese et al. |

FOREIGN PATENT DOCUMENTS

| | | |
|---|---|---|
| CN | 116209258 A | 6/2023 |
| CN | 116209352 A | 6/2023 |
| CN | 116367537 A | 6/2023 |
| CN | 116437661 A | 7/2023 |
| CN | 116723700 A | 9/2023 |
| KR | 20220047047 A | 4/2022 |

\* cited by examiner

SEMICONDUCTOR DEVICE, MANUFACTURING METHOD THEREFOR, AND ELECTRONIC DEVICE

CROSS-REFERENCE TO RELATED APPLICATIONS

This application is a continuation of International PCT Application. No. PCT/CN2024/076732 filed on Feb. 7, 2024, which claims priority to Chinese Patent Application No. 202311000832.9 filed on Aug. 10, 2023, the disclosures of which are hereby incorporated herein by reference in their entireties.

TECHNICAL FIELD

Embodiments of the present disclosure relate to, but are not limited to, device design and manufacturing in the field of semiconductor technologies, in particular to a semiconductor device, a method for manufacturing the semiconductor device, and an electronic device.

BACKGROUND

Semiconductor device memory may be divided into volatile memory and nonvolatile memory in application. The storage cells contained in the memory are often smaller in size through structural design and process improvement, etc. However, with the characteristic size of the two-dimensional planar storage cell getting smaller and smaller, the cost and difficulty of manufacturing memory are getting higher and higher.

Three-dimensional memory architecture can increase the density of storage cells in the vertical direction, which can solve the limitation of storage cell density in the planar memory.

SUMMARY

The following is a summary of the subject matters described in detail in this document. This summary is not intended to limit the scope of protection of the claims.

An embodiment of the disclosure provides a semiconductor device including: multiple storage cells stacked in a direction perpendicular to a base substrate. The multiple storage cells include:
multiple transistors, distributed in different layers and stacked along the direction perpendicular to the base substrate;
a word line, penetrating the different layers and extending in the direction perpendicular to the base substrate;
multiple capacitors, connected with the multiple transistors in a one-to-one correspondence; wherein a capacitor includes a first electrode and a second electrode; a transistor includes a first source/drain electrode, a second source/drain electrode, and a semiconductor layer surrounding a sidewall of the word line; the first source/drain electrode is connected with a first electrode of a corresponding capacitor;
first insulating layers and conductive layers, alternately distributed in the direction perpendicular to the base substrate, wherein each of the conductive layers includes the first source/drain electrode, the second source/drain electrode and the first electrode;
wherein a region of the first electrode includes at least one first hole penetrating each of the first insulating layers and each of the conductive layers, an inner wall of the first hole exposes stacked conductive layers and first insulating layers; and
the second electrode includes an inner electrode disposed in the first hole and insulated from each first electrode, the inner electrode is distributed in the first hole covering a region where each of the conductive layers is exposed to the inner wall of the first hole and a region where each of the first insulating layers is exposed to the inner wall of the first hole.

In some embodiments, the second electrode further includes an outer electrode, the outer wall of the first electrode includes an end face of the first electrode away from the first source/drain electrode and two sidewalls adjacent to the end face, the outer electrode surrounds a end face and two sidewalls of each first electrode.

In some embodiments, the inner electrode includes a first connection electrode filled within the first hole, and a first sub-electrode distributed on the inner wall of the first hole between the first connection electrode and the first electrode.

In some embodiments, the multiple first sub-electrodes of the multiple capacitors are an integrated annular electrode, and the multiple first connection electrodes of the multiple capacitors are an integrated linear electrode.

In some embodiments, the outer electrode includes a second sub-electrode extending along an outer sidewall of the first electrode, and a second connection electrode located on a side of the second sub-electrode away from the first electrode; multiple second sub-electrodes of the multiple capacitors are an integrated structure, and multiple second connection electrodes of the multiple capacitors are an integrated structure.

In some embodiments, the first sub-electrode and the second sub-electrode are connected only at the top of the multiple storage cells stacked to form the integrated structure, and the first connection electrode and the second connection electrode are connected only at the top of the multiple storage cells stacked to form the integrated structure.

In some embodiments, the semiconductor device includes multiple layers of the storage cells, each layer of the storage cells include a storage cell array including multiple rows and columns of storage cells, and second connection electrodes of multiple storage cells stacked in a same column and different layers are connected to form an integrated structure; and second sub-electrodes of multiple storage cells in a same column and stacked in different layers are connected to form an integrated structure.

In some embodiments, the second connection electrode having the integrated structure includes a first portion in a trench between two adjacent storage cells in a row direction and a second portion extending into a trench between two adjacent storage cells in a column direction.

In some embodiments, the first electrode and the first source/drain electrode are an integrated structure extending in a direction parallel to the base substrate, an end face on a side of the integrated structure towards the word line is connected to the semiconductor layer, an end face on a side of the integrated structure away from the word line is connected to the outer electrode of the second electrode through a dielectric layer, and a solid structure in which only the first hole is provided is formed between the end face on the side of the integrated structure towards the word line and the end face on the side of the integrated structure away from the word line side.

In some embodiments, an integrated structure formed by the first electrode of the capacitor and the first source/drain electrode extends in a first direction away from the second source/drain electrode, the region of the first electrode includes multiple first holes, and the multiple first holes are arranged in the first direction, and inner electrodes in the multiple first holes are electrically connected.

In some embodiments, a cross-sectional shape of the first hole in a plane parallel to the base substrate includes: circular, elliptical, or square.

In some embodiments, the semiconductor device further includes: a second hole penetrating each of the first insulating layers and each of the conductive layers, the word line is disposed in the second hole; the first electrode, the first source/drain electrode, the second source/drain electrode are disposed in a same layer, and the first source/drain electrode, the second source/drain electrode are disconnected at the second hole.

Further provided is a method for manufacturing a semiconductor device. The semiconductor device includes multiple transistors distributed in different layers and stacked along a direction perpendicular to a base substrate; a word line penetrating the different layers and extending in the direction perpendicular to the base substrate; multiple capacitors in one-to-one correspondence with the multiple transistors, and the capacitors are connected with corresponding transistors; a capacitor includes a first electrode and a second electrode; a transistor includes a first source/drain electrode, a second source/drain electrode and a semiconductor layer surrounding a sidewall of the word line, and the first source/drain electrode is connected to a first electrode of a corresponding capacitor.

The method for manufacturing the semiconductor device includes:
  forming a stacked structure of alternately stacked first insulating layers and sacrificial layers on the base substrate;
  patterning the stacked structure to form a bit line region extending in a second direction and multiple storage cell regions extending in a first direction and spaced in the second direction; wherein between any two adjacent storage cell regions, there is a trench extending along the first direction and penetrating the stacked structure;
  forming at least one first hole penetrating the stacked structure in the storage cell region and filling a dummy electrode in the first hole;
  performing transverse etching in the trench between any two adjacent storage cell regions to remove each sacrificial layer to expose a dummy electrode of a corresponding region;
  replacing a region where each sacrificial layer removed is located with a conductive layer, to enable the first insulating layers and conductive layers to be alternately stacked, and the conductive layers to surround the dummy electrode; and
  removing the dummy electrode in the first hole to expose conductive layers and first insulating layers continuously distributed on the sidewall of the first hole, forming a dielectric layer of the capacitor on the sidewall of the first hole, and forming an inner electrode of the second electrode of the capacitor in the first hole formed with the dielectric layer.

In some embodiments, a second hole is formed in the storage cell region adjacent to the bit line region, and the semiconductor layer, a gate insulating layer and the word line of the transistor are formed in the second hole; wherein the first hole and the second hole are formed by one patterning process.

In some embodiments, replacing the region where each sacrificial layer removed is located with the conductive layer includes:
  depositing a conductive thin film, wherein the conductive thin film fills the region where the sacrificial layer is located and the trench;
  removing the conductive thin film in the trench by dry etching and forming the conductive layer;
  or, depositing a conductive thin film, which fills the region where the sacrificial layer is located and covers a sidewall and a bottom wall of the trench; and
  removing the conductive thin film in the trench by wet etching and forming the conductive layer.

In some embodiments, the conductive layer includes a first electrode of the capacitor, and the method further includes: exposing an outer wall of the first electrode, wherein the outer wall includes an end face of the first electrode away from the bit line region and two sidewalls adjacent to the end face, an outer electrode of the second electrode of the end face and the two sidewalls of the first electrode, and forming a dielectric layer disposed between the outer wall of the first electrode and the outer electrode.

In some embodiments, the method further includes: forming a trench extending in the second direction and penetrating the stacked structure between two adjacent columns of storage cell regions;
  while forming a dielectric layer of the capacitor on the sidewall of the first hole, depositing the dielectric layer in the trench between the two adjacent columns of the storage cell regions through one process;
  while forming an inner electrode of the second electrode on the sidewall of the first hole, depositing the outer electrode of the second electrode in the trench between the two adjacent columns of the storage cell regions through one process;
  wherein the inner electrode and the outer electrode are an integrated structure.

An embodiment of the present application further provides a semiconductor device, which includes:
  a storage cell array, stacked and periodically distributed in a direction perpendicular to a base substrate;
  each storage cell region includes a transistor and a capacitor sequentially distributed in a first direction;
  a region of the transistor includes a word line hole penetrating various storage cells;
  the semiconductor device further includes conductive layers and first insulating layers alternately stacked;
  a trench for communication is included between adjacent storage cells in the first direction and the second direction, and the trench exposes the conductive layer and an outer sidewall of the first insulating layer;
  a region of the capacitor further includes at least one first hole penetrating each of the conductive layers and each of the first insulating layers, the first hole exposes the conductive layer and an inner sidewall of the first insulating layer; and the conductive layer in the region of the capacitor is annular and adjacent conductive layers are spaced by the first insulating layer.

In some embodiments, the annular conductive layer extends to the word line hole; and the semiconductor device further includes a semiconductor layer located in the word line hole, and the semiconductor layer is in contact with the conductive layer.

In some embodiments, the annular conductive layer is a first electrode of the capacitor, and the semiconductor device further includes a dielectric layer distributed in the first hole and extending only from a topmost storage cell into the trench; and a second electrode of the capacitor distributed in the first hole and extending only from the topmost storage cell into the trench.

An embodiment of the present disclosure provide an electronic device including the semiconductor device described in any of the above embodiments or the semiconductor device manufactured by the semiconductor device manufacturing method described in any of the above embodiments.

Other features and advantages of the present disclosure will be set forth in the following specification, and moreover, partially become apparent from the specification, or are understood by implementing the present disclosure. The objectives and advantages of the present disclosure can be achieved through structures particularly pointed out in the specification and the drawings.

Other aspects may be understood upon reading and understanding the drawings and detailed description.

BRIEF DESCRIPTION OF THE DRAWINGS

Accompanying drawings are used to provide further understanding of technical schemes of the present disclosure, constitute a part of the specification, and are used to explain the technical schemes together with the embodiments of the present disclosure but not to form limitations on the technical schemes of the present disclosure.

DETAILED DESCRIPTION

Figure 1A:
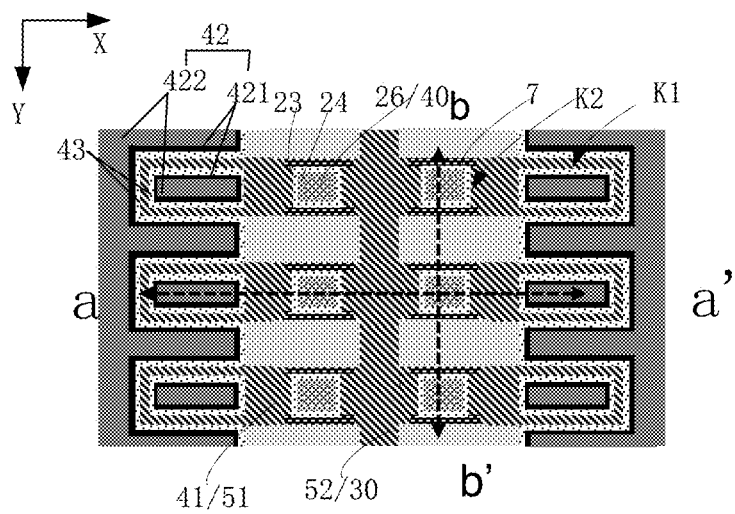
FIG. 1A is a schematic planar view of a semiconductor device according to an exemplary embodiment (a cross-sectional view of a film layer on which a conductive layer is located).

The embodiments of the present disclosure will be described in detail below in conjunction with the accompanying drawings. The embodiments in the present application and features in the embodiments may be combined with each other randomly if there is no conflict.

Unless otherwise defined, technical terms or scientific terms used in the present disclosure shall have a general meaning as understood by a person of ordinary skills in the art to which the present disclosure pertains.

An implementation of the present disclosure is not necessarily limited to dimensions shown in the drawings, and the shapes and sizes of the components in the drawings do not reflect actual scales. Further, the drawings schematically illustrate ideal examples, but embodiments of the present disclosure are not limited to shapes or values shown in the drawings.

Ordinal numerals such as "first", "second" and "third" in the present disclosure are provided to avoid confusion between constituent elements, but do not indicate any order, quantity or importance.

In the present disclosure, for convenience, words or expressions indicating orientation or positional relationship such as "middle", "upper", "lower", "front", "rear", "vertical", "horizontal", "top", "bottom", "inner" and "outer" are employed to explain the positional relationship of the constituent elements with reference to the accompanying drawings, they are employed for case of description of the specification and simplification of the description only, but do not indicate or imply that the referred device or element must have a particular orientation and be constructed and operate in a particular orientation, and therefore cannot be construed as limitations to the present disclosure. The positional relationship of the constituent elements is appropriately changed according to the direction in which various constituent elements are described. Therefore, the present disclose is not limited to the words or expressions described in the present disclosure, and replacement may be appropriately made according to the situation.

In the present disclosure, the terms "mount", "couple" and "connect" should be understood broadly, unless otherwise expressly specified and defined. For example, a connection may be a physical connection or a signal connection; it may be a contact connection or an integrated connection; it may be a direct connection, indirect connection through middleware, or internal communication between two elements. For those of ordinary skills in the art, the specific meaning of the above terms in the present disclosure may be understood according to actual situations.

In the present disclosure, a transistor refers to an element including at least three terminals, i.e., a gate electrode, a drain electrode, and a source electrode. A transistor has a channel region between a drain electrode (drain electrode terminal, drain region, or drain) and a source electrode (source electrode terminal, source region, or source), and a current may flow through the drain electrode, the channel region, and the source electrode. In the present disclosure, the channel region refers to the region through which the current mainly flows.

In the present disclosure, the first source/drain electrode may be a drain electrode and the second source/drain electrode may be a source electrode, or the first source/drain electrode may be a source electrode and the second source/drain electrode may be a drain electrode. In cases that transistors with opposite polarities are used, or a current direction changes during work of a circuit, or the like, functions of the "source electrode" and the "drain electrode" may sometimes be exchanged. Therefore, in the present disclosure, the "source electrode" and the "drain electrode" are interchangeable.

In the present disclosure, a "connection" includes a case where constituent elements are connected together through an element having a certain electrical effect. There is no special restriction on "elements with certain electrical effects" as long as they can transmit and receive electrical signals between connected constituent elements. Examples of "elements having certain electrical effects" include not only electrodes and wiring, but also switching elements (such as transistors), resistors, inductors, capacitors, and other elements having various functions, etc.

In the present disclosure, "parallel" refers to approximately parallel or almost parallel, for example, a state in which the angle formed by two straight lines is −10 degrees or more and 10 degrees or less, and therefore further includes a state in which the angle is −5 degrees or more and 5 degrees or more. In addition, "perpendicular" refers to "approximately perpendicular", for example, a state in which the angle formed by two straight lines is 80 degrees or more and 100 degrees or less, and therefore further includes a state in which the angle is 85 degrees or more and 95 degrees or less.

"A and B are arranged in the same layer" described in the present disclosure includes a film layer of the same material or a film layer formed of different materials located on the same film layer. Exemplarily, A and B are formed by the same film layer from the same material and then are formed by the same patterning process or different patterning processes. A and B arranged in the same layer may be on the same horizontal plane but not necessarily on the same film layer, or on different regions of the same film layer but not necessarily on the same horizontal plane.

The "A and B are an integrated structure" in embodiments of the present disclosure may mean that there is no obvious boundary interface, such as obvious faultage or gaps, viewed from the microstructure. Generally, the connected film layers formed by patterning on one film layer are an integrated structure. For example, A and B use the same material to form one film layer and simultaneously form a structure with a connection relationship through the same patterning process.

In the embodiment of the present disclosure, "an orthographic projection of B is within a range of an orthographic projection of A" means that a boundary of the orthographic projection of B falls within a boundary range of the orthographic projection of A.

Figure 1B:
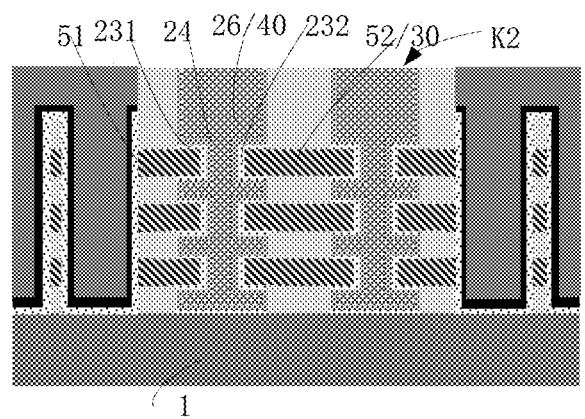
FIG. 1B is a cross-sectional view in the aa' direction in FIG. 1A.
Figure 1C:
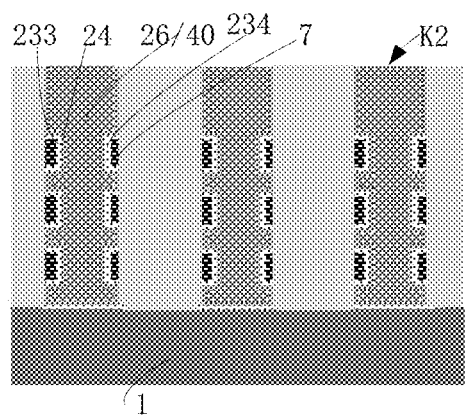
FIG. 1C is a cross-sectional view in the bb' direction in FIG. 1A.

FIG. 1A is a schematic planar view of a semiconductor device according to an exemplary embodiment. FIG. 1B is a cross-sectional view along an aa' direction in FIG. 1A. FIG. 1C is a cross-sectional view along a bb' direction in FIG. 1A. The semiconductor device may be a transistor, or a storage cell including a transistor, or a storage cell array including a storage cell, or a 3D stacked structure including a storage cell array, or a memory including a transistor or a storage cell array, etc.

As shown in FIGS. 1A, 1B, and 1C, an embodiment of the present disclosure provides a semiconductor device that may include multiple storage cells stacked in a direction perpendicular to a base substrate 1. The multiple storage cells may include: multiple transistors, a word line 40, multiple capacitors, first insulating layers and conductive layers.

The multiple transistors are in one-to-one correspondence with the multiple storage cells, the multiple transistors are distributed in different layers and stacked in a direction perpendicular to the base substrate 1, which may be understood as multiple transistors stacked into a vertical column in the direction perpendicular to the base substrate 1 and insulated from each other in the direction perpendicular to the base substrate 1.

The word line 40 is connected to the multiple transistors, penetrates the transistors of the different layers and extends in the direction perpendicular to the base substrate 1.

The multiple capacitors are in one-to-one correspondence with the multiple transistors. The capacitors are connected to the corresponding transistors. 1T1C storage cells are formed in some embodiments. A capacitor includes a first electrode 41 and a second electrode 42 spaced by a dielectric layer 43. A transistor includes a first source/drain electrode 51, a second source/drain electrode 52 isolated from each other, and a semiconductor layer 23 surrounding a sidewall of the word line 40. The first source/drain electrode 51 is electrically connected to a first electrode 41 of a corresponding capacitor.

The first insulating layers and conductive layers are alternately distributed in sequentially in the direction perpendicular to the base substrate 1. A region of the first electrode 41 includes at least one first hole K1 penetrating each of the first insulating layers and each of the conductive layers stacked, an inner wall of the first hole only exposes the stacked conductive layer and first insulating layer; wherein, the conductive layer may be formed by replacing a sacrificial layer; the sacrificial layers before replacement and the first insulating layers are alternately stacked and distributed.

The capacitors and transistors of each storage cell are sequentially arranged in a first direction.

The number of the first holes may be one, two, or more, and in some embodiments, the number of the first holes are two or more, and different first holes are sequentially spaced in the first direction.

The first electrode 41, the first source/drain electrode 51 and the second source/drain electrode 52 included in one storage cell are arranged in one conductive layer, which may be understood that the conductive layer includes the first electrode 41, the first source/drain electrode 51 and the second source/drain electrode 52 in different regions after the conductive layer is subjected to a patterning process. The first electrode 41 and the first source/drain electrode 51 are not disconnected and form an integrated structure, the first electrode has an opening formed by the first hole, each first hole corresponds to an opening. In some embodiments, the number of the openings on the first electrode is one, and both the first electrode and the first insulating layer between adjacent first electrodes are annular.

In an embodiment of the present application, the stacked first electrodes are identical in shape, and the stacked first insulating layer is identical in shape with and completely overlaps with the first electrodes (the projections on the base substrate completely overlap).

In some embodiments, the region of the transistor includes a word line hole (a second hole K2) that penetrates various storage cells.

Based on the alternately stacked conductive layers and first insulating layers described above; there is a trench for communication between adjacent storage cells in the first direction and the second direction, and the trench exposes the conductive layer and the outer sidewall of the first insulating layer; the outer sidewall of each conductive layer or each first insulating layer exposed by the trench includes one end part in the first direction and two sidewalls in the second direction.

The region of the capacitor further includes at least one first hole penetrating various conductive layers and first insulating layers, the first hole exposes the conductive layers and the inner sidewalls of the first insulating layers; and adjacent conductive layers in the region of the capacitor are spaced by the first insulating layer.

The second electrode 42 may include an inner electrode disposed in the first hole K1 and insulated from the first electrode 41. On a plane perpendicular to the base substrate 1, the inner electrode extends to the first electrode 41 of the storage cell of each layer, and at least surrounds the sidewall of the first hole K1, or may fill various regions of the first hole K1. The inner electrode is distributed in the first hole K1 covering a region wherein each of the conductive layers is exposed to the inner wall of the first hole K1 and a region where each of the first insulating layers is exposed to the inner wall of the first hole K1. In some embodiments, the inner electrodes filling various regions of the first hole K1 may include a first sub-electrode surrounding a sidewall of the first hole K1 and a first connection electrode filling the first hole K1, and the first connection electrode contacts a region on a side of the first sub-electrode away from the sidewall of the first hole K1. The first sub-electrode and the first connection electrode may be made from different materials, the first connection electrode may be used to connect the first sub-electrode to a reference signal terminal, or the first connection electrode may be used to connect with an outer electrode of the second electrode.

It may be understood that the first hole K1 is a through hole towards the base substrate 1 in the solid structure, and the through hole of the first electrode 41 exposes the inner sidewall of the first electrode 41, on which the dielectric layer 43 of the capacitor and the second electrode 42 of the capacitor are formed. The inner electrode of the second electrode 42 may be a film layer extending along the hole wall of the first hole K1, in some embodiments, the hole wall of the first hole K1 is perpendicular to the base substrate 1, and the inner electrode of the second electrode 42 may be an annular film layer extending in a direction perpendicular to the base substrate 1, or a solid structure filling the first hole K1, or include both the annular film layer and the solid structure, both of which are conductive materials and in contact with each other.

According to the scheme provided by the present embodiments, the second electrode of the capacitor is included in the first hole penetrating the first electrode, so that an area occupied by the capacitor can be reduced, thereby reducing the area of the semiconductor device and increasing the density of the semiconductor device.

In some embodiments, the storage cell of the semiconductor device may further include: a second hole K2 penetrating each of the first insulating layers and each of the first source/drain electrodes 51. The second hole K2 is a word line hole, and the second hole K2 may include a first sub-hole located in the first insulating layer and a second sub-hole located in the conductive layer.

The word line 40 and the multiple semiconductor layers 23 are disposed in the second hole K2, an orthographic projection of a second sub-hole, located on the conductive layer, of the second hole K2, on the base substrate 1 may fall into an orthographic projection of a first sub-hole, located on the first insulating layer, of the second hole K2, on the base substrate 1. The multiple semiconductor layers 23 of the multiple transistors are arranged at intervals.

The multiple semiconductor layers 23 of the multiple transistors are arranged at intervals, that is, the multiple semiconductor layers 23 of the multiple transistors are physically disconnected, thereby eliminating parasitic MOS transistors (which may be understood as parasitic transistors) between transistors on adjacent layers. According to the semiconductor device provided by the present embodiment, since the apertures of the second holes K2 in the conductive layer and in the first insulating layer are different and the aperture thereof in the first insulating layer is larger, the parasitic channel may be removed from the outer side of the second hole K2 when the semiconductor device is manufactured. Compared with removing the parasitic channel from the inner side of the second hole K2, the process is simpler, the channel of the transistor is not easily damaged, and the device performance is improved. However, the embodiment of the present disclosure is not limited thereto, and an orthographic projection of the first sub-hole on the base substrate 1 may fall into an orthographic projection of the second sub-hole on the base substrate 1, so that the parasitic channel may be removed from the inner side of the second hole K2.

In some embodiments, the first hole K1 and the second hole K2 penetrate each conductive layer and the first insulating layers between the conductive layers, and the first insulating layer below the bottom conductive layer that is penetrated may not be penetrated.

The first electrode 41 may include top and bottom approximately parallel to the base substrate 1, and an outer wall between the top and the bottom. The first electrode 41 has an end face in an extension direction parallel to the base substrate 1, and the outer sidewall includes the end face.

In some embodiments, a surface of the outer sidewall extends in the direction perpendicular to the base substrate 1. In some other embodiments, the outer sidewall does not have to be perpendicular to the base substrate 1, as long as it is located between the top and bottom and may not be perpendicular to the base substrate 1.

In some embodiments, the second electrode 42 located in the stacked structure may include only the inner electrode, i.e., only the electrode located within the first hole K1.

In some embodiments, the second electrode 42 located in the stacked structure may include an electrode located on the outer wall of the first electrode 41 in addition to an electrode located in the first hole K1. The electrode located in the hole of the first electrode 41 and the electrode of the outer sidewall together form a second electrode 42 insulated from the first electrode 41, and the second electrode 42 may be connected to a reference signal terminal.

Referring to FIGS. 1A, 1B, and 1C, the second electrode 42 may further include: an outer electrode extending in the direction perpendicular to the base substrate 1 and extending along an outer wall of the first electrode 41 and an outer wall of the first insulating layer and insulated from the first electrode 41, and the outer electrode in the horizontal direction (parallel to the direction of base substrate 1) is electrically connected to the inner electrode. The outer sidewall of the first electrode 41 includes a first end face of the first electrode 41 away from the first source/drain electrode 51 (or word line 40), and two first sidewalls adjacent to the first end face, both the first end face and the two first sidewalls extend in the direction perpendicular to the base substrate 1, and the outer electrode may surround the first end face and the two first sidewalls of each of the first electrodes 41. The outer sidewall of the first insulating layer may include a second end face away from the first source/drain electrode 51 (or word line 40) and two second sidewalls adjacent to the second end face, both the second end face and the two second sidewalls extend in the direction perpendicular to the base substrate 1, and the outer electrode may surround the second end face and the two second sidewalls of each of the first insulating layers.

The outer electrode may wrap the first end face of the first electrode 41 away from the word line 40 and two first sidewalls adjacent to the first end face and extending in the direction perpendicular to the base substrate 1. That is, the second electrode 42 includes two parts, one part is arranged in the first hole K1, and the other part is arranged on the surface of the first electrode 41, wrapping three sidewalls of the first electrode 41 (one sidewall is called the first end face). Compared with a capacitor including only the outer electrode, the capacitor according to the scheme provided by the present embodiment can include an inner electrode and an outer electrode, and the capacitance can be increased as much as possible under a condition that the length of the capacitor is constant. A first insulating layer is provided between the first electrodes 41 adjacent in the direction perpendicular to the base substrate 1, so that the outer electrode further wraps one end face of the first insulating layer and two sidewalls adjacent to the end face, while the inner electrode is provided in the first hole K1. In the conductive layer, the inner electrode and the outer electrode are separated from each other by the first electrode 41 and are not connected to each other, and in the first insulating layer, the inner electrode and the outer electrode are separated from each other by the first insulating layer and are not connected to each other. That is, the outer electrode and the inner electrode are spaced from each other between the first electrodes 41 adjacent in the direction perpendicular to the base substrate 1. According to the scheme provided by the embodiment, in the manufacturing process, the first insulating layer can support the first electrodes 41 stacked along the direction perpendicular to the base substrate 1, without an additional support structure, thus simplifying the process and reducing the process difficulty.

In some embodiments, the inner electrode may extend in the direction perpendicular to the base substrate 1, and cover various regions of the inner wall of the first hole K1.

In some embodiments, the inner electrode may fill the first hole K1 till the first hole K1 is fully filled.

In some embodiments, the inner electrodes of the capacitors of the storage cells of the same vertical column stacked along the direction perpendicular to the base substrate 1 may be connected to form an integrated structure.

In some embodiments, the outer electrodes of the capacitors of the storage cells of the same vertical column stacked along the direction perpendicular to the base substrate 1 may be manufactured by atomic layer deposition, and connected to form an integrated structure.

In some embodiments, the inner electrode and the outer electrode may be of a double-layer structure, respectively, i.e., the inner electrode may include a first sub-electrode and a first connection electrode, the first sub-electrode is disposed between the dielectric layer 43 and the first connection electrode. The outer electrode may include a second sub-electrode and a second connection electrode, and the second sub-electrode is disposed between the dielectric layer 43 and the second connection electrode. The first sub-electrode isolates the dielectric layer 43 from the first connection electrode (i.e., the first connection electrode does not contact the dielectric layer 43), and the second sub-electrode isolates the dielectric layer 43 from the second connection electrode (i.e., the second sub-electrode does not contact the dielectric layer 43). The second sub-electrode and the second connection electrode may be made from different materials, the second connection electrode is configured to connect the second sub-electrode to a reference signal terminal, or the second connection electrode is configured to connect with the first connection electrode. The first sub-electrode and the second sub-electrode may be metal or metal nitride, such as TiN and other materials suitable for capacitor electrodes, and the first connection electrode and the second connection electrode may be conductive materials with less resistance than the second sub-electrode, such as polysilicon.

In some embodiments, the first connection electrode fills the first hole K1, the first sub-electrode is located between the first connection electrode and the first electrode and is distributed on the inner wall of the first hole K1, and the first sub-electrode surrounds the sidewall of the first hole K1, and the first connection electrode is in contact with a region on a side of the first sub-electrode away from the sidewall of the first hole K1.

In some embodiments, the first sub-electrode may be an annular electrode extending in the direction perpendicular to the base substrate 1, and the first connection electrode may be a linear electrode extending in the direction perpendicular to the base substrate 1.

In some embodiments, the second sub-electrode may extend along the outer sidewall of the first electrode 41.

In some embodiments, an integrated structure formed by connecting the first and second sub-electrodes of the same capacitor is referred to as a first sub-layer 421, and an integrated structure formed by connecting the first and second connection electrodes of the same capacitor is referred to as a second sub-layer 422. That is, the second electrode 42 may include a first sub-layer 421 and a second sub-layer 422. The first sub-layer 421 is disposed between the second sub-layer 422 and the dielectric layer 43, and isolates the second sub-layer 422 and the dielectric layer 43, a portion of the first sub-layer 421 and a portion of the second sub-layer 422 form the inner electrode, and a portion of the first sub-layer 421 and a portion of the second sub-layer 422 form the outer electrode.

In some embodiments, the semiconductor device may include a multi-layer storage cell array distributed in the direction perpendicular to the base substrate 1. Each layer of storage cell array includes multiple rows and columns of storage cells arrayed in a first direction X and a second direction Y, respectively (the columns here are horizontal columns, distinguished from the foregoing vertical columns, one vertical column includes a row of storage cells distributed at the same position on different layers, and in subsequent descriptions, those not specified as vertical columns are all horizontal columns). Among the storage cells on the same layer, a group of storage cells distributed along the first direction X is called a row of storage cells, and a group of storage cells distributed along the second direction Y is called a column of storage cells. The second connection electrodes of the capacitors of multiple storage cells stacked and distributed in the same column and on different layers are connected to form an integrated structure, and the second sub-electrodes of the capacitors of multiple storage cells stacked and distributed in the same column and on different layers are connected to form an integrated structure.

In some embodiments, the second connection electrode of the integrated structure may include a first portion in a trench between two adjacent columns of storage cells in the row direction (i.e., the first direction X) and a second portion extending into the trench between two adjacent storage cells in the column direction (i.e., the second direction Y). The second connection electrode may provide a support function for the semiconductor device, thereby eliminating the need for an additional support film layer.

In some embodiments, the inner and outer electrodes may be connected only at the top of the multiple storage cells stacked (i.e., the side of the multiple transistors stacked away from the base substrate 1).

In some embodiments, the inner and outer electrodes are connected on a side of the plurality of stacked transistors away from the base substrate 1 to form a planar film layer extending in a direction parallel to the base substrate 1, and the orthographic projections of the word line 40, the semiconductor layer 23, and the second source/drain electrode 52 are located outside an orthographic projection of the planar film layer on the base substrate 1. In the process of manufacturing semiconductor devices, capacitors are usually prepared first, and then word lines and semiconductor layers are prepared. After capacitors are prepared, the regions where word lines and semiconductor layers are located need to be exposed, which is convenient for subsequent preparation of word lines and semiconductor layers.

In some embodiments, the first sub-electrode and the second sub-electrode of the same capacitor may be connected only at the top of the multiple storage cells stacked to form an integrated structure, and the first connection electrode and the second connection electrode of the same capacitor are connected only at the top of the multiple storage cells stacked to form an integrated structure.

In some embodiments, the first electrode 41 and the first source/drain electrode 51 may be connected to form an integrated structure, or both may be multiplexed as one electrode, which may be a wire extending transversely in a direction parallel to the base substrate 1, for example, may extend in the first direction X. An end face of the integrated structure towards the word line 40 is connected to the semiconductor layer 23, and an end face away from the word line 40 is connected to an outer electrode of the second electrode 42 through a dielectric layer 43. A solid structure with only the first hole K1 is formed between the end face of the integrated structure towards the word line 40 and the end face away from the word line 40. That is, the integrated structure is a solid structure except the region where the first hole K1 is located. In the direction parallel to the base substrate 1, the solid structure includes two ends, one end of which is connected to the semiconductor layer 23, and the other end of which is surrounded by the outer electrode 42.

In some embodiments, the first source/drain electrode 51 and the second source/drain electrode 52 may be located in the same conductive film layer and isolated from each other in the direction perpendicular to the base substrate 1. It may be understood that the first source/drain electrode 51 and the second source/drain electrode 52 are patterned from the same conductive film layer. In some embodiments, the conductive film layer is approximately parallel to the upper surface of the base substrate 1. However, the embodiment of the present disclosure is not limited thereto, and the first source/drain electrode 51 and the second source/drain electrode 52 may be located in different conductive film layers.

In some embodiments, the transistor may further include a gate electrode 26, and the gate electrodes 26 of transistors of different layers may be a part of the word line 40. It may be understood that before and after the word line 40 is formed, there is no need to additionally manufacture the gate electrode 26, and after the word line 40 is manufactured, a part of the word line 40 functions as the gate electrode 26.

In some embodiments, the sidewalls of the second hole K2 may include a first sidewall located in the first sub-hole and a second sidewall located in the second sub-hole and connected to the first sidewall. The first sidewall forms a groove relative to the second sidewall, and the groove includes a sub-sidewall extending in the direction perpendicular to the base substrate 1. The semiconductor layer 23 continuously extends on and from the second sidewall to the sub-sidewall of the groove extending the direction perpendicular to the base substrate 1, and is not distributed on the sub-sidewall, such that the multiple semiconductor layers 23 are disconnected on the sub-sidewall. That is, the cross section of the semiconductor layer 23 in the direction perpendicular to the base substrate 1 may be two U-shaped structures distributed on both sides of the word line 40, and the opening directions of the U-shaped structures are away from the word line 40.

In some embodiments, the semiconductor layer 23 may include a first groove 231 of which the opening is towards the first source/drain electrode 51 and a second groove 232 of which the opening is towards the second source/drain electrode 52. The first source/drain electrode 51 fills the first groove 231, and the second source/drain electrode 52 fills the second groove 232. According to the scheme provided by the embodiment, the semiconductor layer 23 may be in contact with the upper surfaces, the lower surfaces and the sidewalls of the first source/drain electrode 51 and the second source/drain electrode 52. Compared with the scheme in which the semiconductor layer 23 is in contact with only the sidewalls of the first source/drain electrode 51 and the second source/drain electrode 52, the contact area can be increased and the contact resistances between the first source/drain electrode 51 and the semiconductor layer 23 and between the second source/drain electrode 52 and the semiconductor layer 23 can be reduced. The first groove 231 and the second groove 232 may be two independent grooves, or when the semiconductor layer 23 forms a continuous annular groove around the word line 40, the first groove 231 may be a groove formed by a region where the annular groove contacts the first source/drain electrode 51, and the second groove 232 may be a groove formed by a region where the annular groove contacts the second source/drain electrode 52.

Figure 26A:
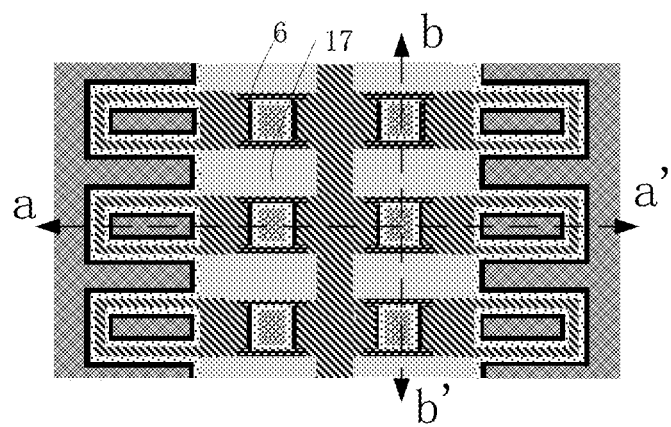
FIG. 26A is a cross-sectional view (a film layer on which the conductive layer 12 is located) in a direction parallel to the base substrate after a semiconductor layer is etched.
Figure 26B:
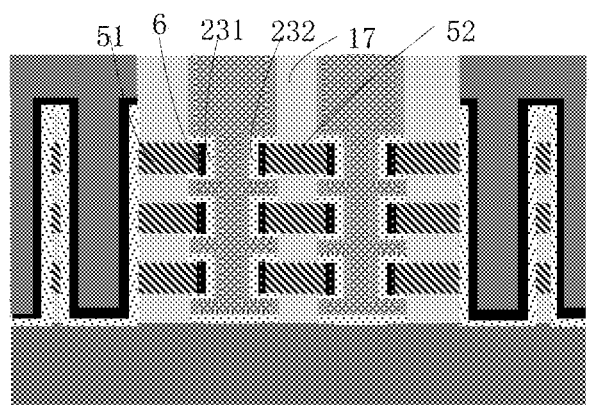
FIG. 26B is a cross-sectional view in the aa' direction in FIG. 26A.
Figure 26C:
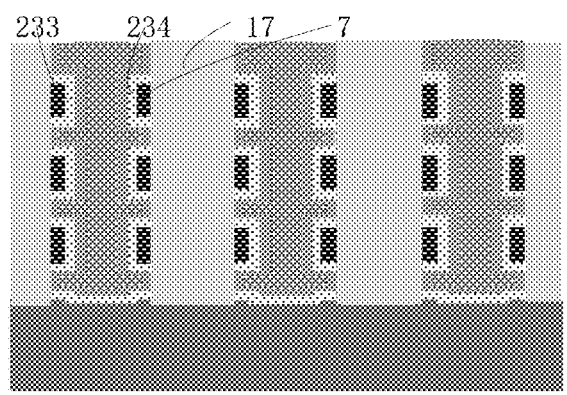
FIG. 26C is a cross-sectional view in the bb' direction in FIG. 26A.

In some embodiments, as shown in FIGS. 26A, 26B and 26C, the semiconductor layer 23 may include a first groove 231 of which the opening is towards the first source/drain electrode 51 and a second groove 232 of which the opening is towards the second source/drain electrode 52. The first source/drain electrode 51 fills the first groove 231, and the second source/drain electrode 52 fills the second groove 232. And a contact layer 6 is provided between the sidewall of the first source/drain electrode 51 towards the word line 40 and the semiconductor layer 23, and between the sidewall of the second source/drain electrode 52 towards the word line 40 and the semiconductor layer 23. A material may be selected such that the contact resistance between the contact layer 6 and the semiconductor layer 23 is smaller than the contact resistance when the semiconductor layer 23 directly contacts the first source/drain electrode 51 and the second source/drain electrode 52, thereby reducing the contact resistances between the semiconductor layer 23 and the first source/drain electrode 51 and between the semiconductor layer 23 and the second source/drain electrode 52.

In some embodiments, the semiconductor layer 23 may further include a third groove 233 and fourth groove 234 of which the openings are away from the word line 40 and the first source/drain electrode 51, the third groove 233 and the fourth groove 234 are disposed opposite to each other and have openings away from each other. The semiconductor device may further include a barrier layer 7 that fills the third groove 233 and the fourth groove 234. The third groove 233 and the fourth groove 234 may be two independent grooves, or when the semiconductor layer 23 forms a continuous annular groove around the word line 40, the barrier layer 7 includes two independent portions, the third groove 233 may be a groove formed by a region where the annular groove contacts a part of the barrier layer 7, and the fourth groove 234 may be a groove formed by a region where the annular groove contacts another part of the barrier layer 7.

In some embodiments, the barrier layer 7 may be provided only within the third groove 233 and the fourth groove 234.

In some embodiments, the barrier layer 7 may be connected to the first source/drain electrode 51 and the second source/drain electrode 52.

In some embodiments, the barrier layers 7 of the third groove 233 and the fourth groove 234 of the semiconductor layer 23 filled in the transistors of different layers are spaced from each other, i.e., the barrier layers 7 of the third groove 233 and the fourth groove 234 of the semiconductor layer 23 filled in the transistors of different layers are physically disconnected.

In some embodiments, the region of the first electrode 41 may include multiple first holes K1 (i.e., multiple first holes K1 are provided on one first electrode 41), and the multiple first holes K1 may be arranged in an extension direction of an integrated structure formed by the first electrode 41 and the first source/drain electrode 51, such as in the first direction X. However, the embodiment of the present disclosure is not limited thereto, and the multiple first holes K1 may be arranged in other ways. A second electrode 42 insulated from the first electrode 41 is provided in each of the first holes K1, and the second electrode 42 in the first hole K1 is an inner electrode. The multiple inner electrodes in the different first holes K1 are electrically connected, for example, through the top ends of the inner electrodes.

In some embodiments, the cross-sectional shape of the first hole K1 in a plane parallel to the base substrate 1 includes, but is not limited to, circular, elliptical or square.

In some embodiments, in a direction parallel to the base substrate 2, the first hole K1 may have the same shape in a first cross section of a sub-hole of the conductive layer and in a second cross section of a sub-hole of the first insulating layer.

In some embodiments, the sizes of the first cross section and the second cross section may be the same. That is, the first hole may be formed by one etching without expanding the first hole in the first insulating layer or the conductive layer, and the process is simple.

In some embodiments, the transistor may further include a gate insulating layer 24 disposed between the word line 40 and the semiconductor layer 23.

In the second hole K2, the word line 40, the gate insulating layer 24 surrounding the sidewalls of the word line 40, and the multiple semiconductor layers 23 surrounding different regions of the sidewalls of the gate insulating layer 24 are sequentially distributed from inside to outside.

The gate insulating layers 24 of multiple transistors of different layers may be connected to form an integrated structure. However, embodiments of the present disclosure are not limited thereto, and the gate insulating layers 24 of multiple transistors of different layers may be disconnected.

In some embodiments, the aperture of the first sub-hole along a direction parallel to the extension direction of the first source/drain electrode 51 may be larger than the aperture of the first sub-hole along a direction perpendicular to the extension direction of the first source/drain electrode 51.

As shown in FIG. 1A, storage cells of the same layer form an array of storage cells distributed in the first direction X and the second direction Y, respectively, and each layer may further include a bit line 30 connected to the second source/drain electrode 52 of the same column of transistors in one layer. FIG. 1A shows that each layer includes three rows and two columns of storage cells, but the embodiment of the present disclosure is not limited thereto, and each layer may include other rows and columns of storage cells, for example, may include only one storage cell. The aa' direction may be parallel to the first direction X, and the bb' direction may be parallel to the second direction Y.

In some embodiments, second source/drain electrodes 52 of transistors of two adjacent columns of storage cells may be connected to the same bit line 30.

In some embodiments, the second source/drain electrode 52 of the transistor may be a part of a bit line 30 to which the second source/drain electrode 52 is connected. For example, the bit line 30 is a straight line, the sidewalls of which are connected to the semiconductor layer 23, or the bit line 30 has an integrally designed branch, which is connected to the semiconductor layer 23, wherein the extension direction of the branch intersects, e.g., is approximately perpendicular to, the extension direction of the bit line 30.

The branch may be multiple branches on one sidewall of the bit line 30 or multiple branches on both sidewalls, each of the branches corresponds to a transistor or a storage cell formed.

In some embodiments, the bit line 30 may extend in the second direction Y.

In some embodiments, the first source/drain electrode 51 may extend in the first direction X.

In some embodiments, the first electrode 41, the first source/drain electrode 51, and the second source/drain electrode 52 may be arranged in the same layer, and the first source/drain electrode 51, the second source/drain electrode 52 are disconnected at the second hole K2. That is, the first electrode 41, the first source/drain electrode 51, and the second source/drain electrode 52 may be formed by one patterning process. The same layer arrangement may be understood as a film layer on the same layer formed by a patterning process of the same conductive layer. One patterning process may be understood as at least using one mask to form different patterns at the same time.

Technical schemes of the embodiments will be further explained through a manufacturing process of the semiconductor device of the embodiment. A "patterning process" mentioned in the embodiments includes film layer deposition, photoresist coating, mask exposure, development, etching, photoresist stripping, and other treatments, and is a mature manufacturing process in related technologies. A "photolithography process" in the embodiments includes film layer coating, mask exposure, and development, and is a mature manufacturing process in the related technologies. Known processes such as sputtering, evaporation, chemical vapor deposition may be used for the deposition, known coating processes may be used for the coating, and known approaches may be used for etching, which are not specifically limited here. In description of the embodiments, it should be understood that a "thin film" refers to a layer of thin film made of a certain material on a base substrate using a deposition or coating process. If the "thin film" does not need a patterning process or photolithography process during the whole manufacturing process, the "thin film" may also be called a "layer". If the "thin film" needs a patterning process or photolithography process during the whole manufacturing process, it is called a "thin film" before the patterning process and a "layer" after the patterning process. The "layer" after the patterning process or photolithography process contains at least one "pattern".

In an exemplary embodiment, the manufacturing process of the semiconductor device may include the following acts.

Figure 2A:
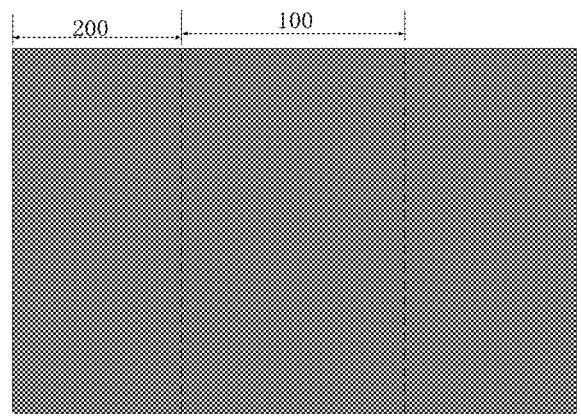
FIG. 2A is a schematic planar view of a base substrate according to an exemplary embodiment.
Figure 2B:
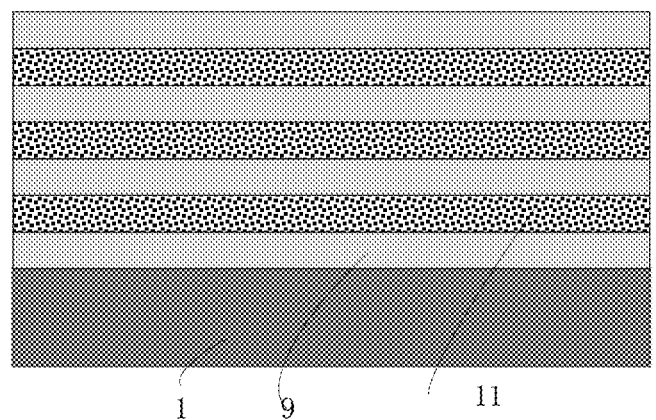
FIG. 2B is a cross-sectional view along a direction parallel to a base substrate after a stacked structure is formed according to an exemplary embodiment.

101) Sequentially and alternately depositing first insulating thin films and sacrificial layer thin films on the base substrate 1 to form multiple stacked structures. FIG. 2A is a schematic planar view of the base substrate 1, and FIG. 2B is a cross-sectional view of the stacked structure in a direction perpendicular to the base substrate. As shown in FIG. 2A, the base substrate 1 may include a transistor region 100 and two capacitor regions 200 disposed on both sides of the transistor region 100, and the multiple stacked structures are disposed on the transistor region 100 and the capacitor region 200. As shown in FIG. 2B, the stacked structure may include a stack of first insulating layers 9 and sacrificial layers 11 arranged alternately.

In some embodiments, the base substrate 1 may be understood as a supporting structure. It may be a silicon base substrate, or a base substrate containing logic circuits or other types of circuits.

In some embodiments, the first insulating thin film may be a low-K dielectric layer, i.e., a dielectric layer having a dielectric constant not greater than 3.9, which includes, but not limited to, a silicon oxide such as silicon dioxide ($SiO_2$), etc. The materials of the multiple layers of the first insulating layers 9 may be the same or different.

In some embodiments, the sacrificial layer thin film includes a film layer that has a larger etching selectivity ratio than the first insulating thin film, including but not limited to SiN (silicon nitride). In the embodiment, no conductive thin film is deposited when the stacked structure is manufactured, and when the stacked structure is etched in the subsequent process, a smooth and vertical surface may be formed more easily than the stacked structure formed by etching the insulating thin film and the conductive thin film, the device structure can be better controlled, and the device performance is more stable.

In some embodiments, the first insulating thin film and the sacrificial layer thin film may be deposited using a chemical vapor deposition approach.

The stacked structure shown in FIG. 2B includes four layers of first insulating layers 9 and three layers of sacrificial layers 11, which is only an example. In some other embodiments, the stacked structure may include more or fewer layers of the first insulating layers 9 and the sacrificial layers 11 that are alternately arranged.

Act 101 may also be replaced by the following scheme. In some embodiments, first insulating layers and conductive layers are alternately deposited on the base substrate, the conductive layers are used to form electrodes, connected to transistors, of capacitors, and to form bit lines, etc. The act of replacing the sacrificial layers with the conductive layers after the insulating layers and the sacrificial layers are alternately formed may be omitted.

102) Etching the multiple stacked structures to form a preset pattern.

Figure 3:
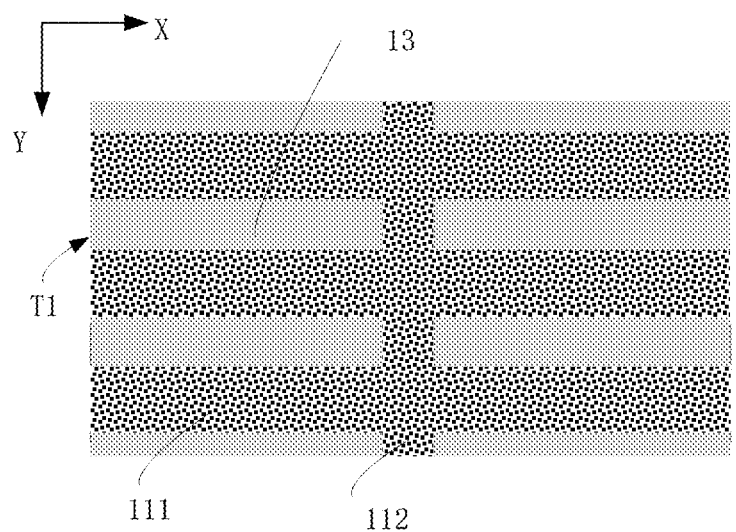
FIG. 3 is a cross-sectional view of a film layer on which the sacrificial layer is located in a direction parallel to a base substrate after a preset pattern is formed according to an exemplary embodiment.

The etching the multiple stacked structures to form a preset pattern may include:
  defining a pattern of an active region by using the first mask, wherein the pattern of the active region is a preset pattern;
  etching the multiple stacked structures to form multiple first trenches T1 penetrating the multiple stacked structures; wherein the multiple first trenches T1 cause the preset patterns to be formed on the first insulating layer 9 and the sacrificial layer 11; the preset pattern of the sacrificial layer 11 includes patterns of the first source/drain electrode 51 and the second source/drain electrode 52 of the transistor to be formed subsequently, a pattern of the bit line 30, and a pattern of the first electrode 41 of the capacitor; the preset pattern of the sacrificial layer 11 may include multiple first sub-portions 111 and a second sub-portion 112 connecting the first sub-portions 111, the first sub-portion 111 may extend in the first direction X and the second sub-portion 112 may extend in the second direction Y; the region where the first sub-portion 111 is located is referred to as a storage cell region, and the region where the second sub-portion 112 is located is referred to as a bit line region;
  depositing and grinding a second insulating thin film, and forming a second insulating layer 13 filling multiple the first trenches T1; wherein the second insulating layer 13 may be flush with the topmost first insulating layer 9, as shown in FIG. 3, FIG. 3 is a cross-sectional view of the film layer where the sacrificial layer 11 is located along the direction parallel to the base substrate 1 after the preset pattern is formed. The first direction X and the second direction Y may intersect. In some embodiments, the first direction X and the second direction Y may be perpendicular to each other.

In some embodiments, the second insulating thin film may be a low-K dielectric layer including but not limited to a silicon oxide such as silicon dioxide ($SiO_2$), etc. The materials of the first insulating layer 9 and the second insulating layer 13 may be the same or different.

103) Simultaneously or sequentially forming a first hole K1 and a second hole K2.

Figure 4:
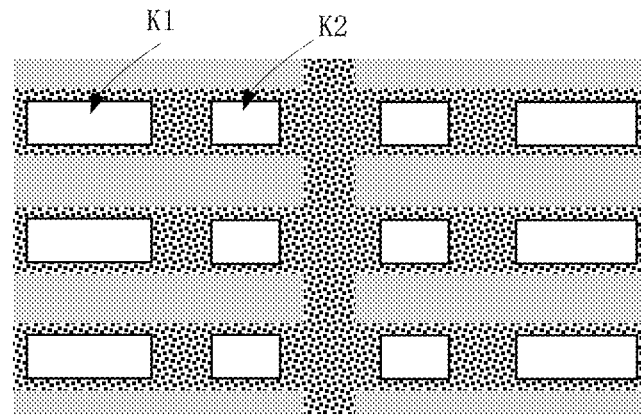
FIG. 4 is a cross-sectional view of the film layer on which the sacrificial layer is located in a direction parallel to the base substrate after a first hole and a second hole are formed according to an exemplary embodiment.

The simultaneous forming the first hole K1 and the second hole K2 may include:
  defining the patterns of the first hole K1 and the second hole K2 by using the second mask; wherein the first hole K1 is used to form the electrode of the capacitor, the first hole K1 is only used to distinguish the second hole K2, and the number of the first holes K1 in a storage cell may be one or more;
  etching the multiple stacked structures and forming multiple first holes K1 and multiple second holes K2 penetrating the multiple stacked structures, wherein the first hole K1 is located in the capacitor region 200 and the second hole K2 is located in the transistor region 100, as shown in FIG. 4, which is a cross-sectional view of the film layer where the sacrificial layer 11 is located in the direction parallel to the base substrate 1 after the first hole K1 and the second hole K2 are formed. The first hole K1 extends in the direction perpendicular to the base substrate 1, and the second hole K2 extends in the direction perpendicular to the base substrate 1.

In some embodiments, the first sub-portion 111 may include a first hole K1 and a second hole K2. However, the embodiment of the present disclosure is not limited thereto, and the first sub-portion 111 may include more first holes K1, for example, may include two first holes K1, which may be arranged in the extending direction (i.e., the first direction X) of the first sub-portion 111. However, the embodiment of the present disclosure is not limited thereto. When there are multiple first holes K1, the arrangement of the multiple first holes K1 is not limited.

In some embodiments, the cross section of the first hole K1 in the direction parallel to the base substrate 1 may be square, circular, elliptical or the like.

In some embodiments, when there are multiple first holes K1, the multiple first holes K1 may be of the same size and shape, or may be of different sizes and shapes.

In some embodiments, the multiple stacked structures may be dry etched to form the first hole K1 and the second hole K2.

In this embodiment, the first hole K1 and the second hole K2 are simultaneously formed by a same patterning process, thereby reducing process acts and reducing costs. However, the embodiment of the present disclosure is not limited thereto, and the first hole K1 and the second hole K2 may be respectively formed by multiple patterning processes. The one patterning process may at least be understood as simultaneously forming patterns of the first hole K1 and the second hole K2 using a mask.

104) Forming a dummy electrode 8.

Figure 5:
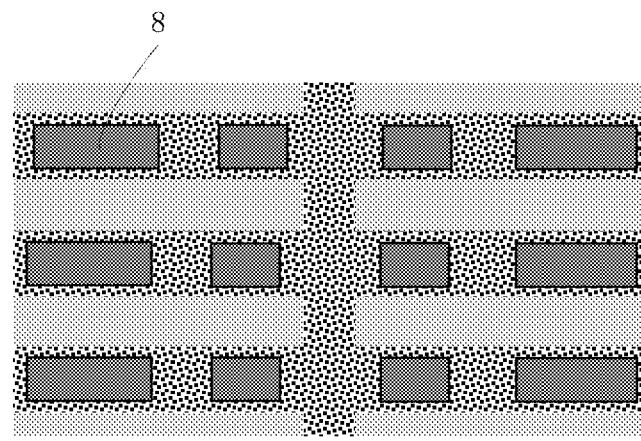
FIG. 5 is a cross-sectional view of the film layer on which the sacrificial layer is located in a direction parallel to the base substrate after a dummy electrode is formed according to an exemplary embodiment.

Forming the dummy electrode 8 may include: depositing a dummy layer thin film on the base substrate 1 on which the aforementioned structures are formed, and grinding to form the dummy electrode 8 filling with the first hole K1 and the second hole K2, as shown in FIG. 5, which is a cross-sectional view of the film layer where the sacrificial layer 11 is located along the direction parallel to the base substrate 1 after the dummy electrode 8 is formed. The dummy electrode 8 may be used as a dummy word line (dummy WL) to protect the region where the word line 40 is located. The dummy electrode 8 may be flush with the topmost first insulating layer 9.

In some embodiments, the dummy layer thin film may be a material different from the first insulating thin film, the second insulating thin film, for example, may be polysilicon (poly), silicon oxide carbon ceramic (SiOC), etc.

105) Etching and removing the second insulating layer 13 to form a conductive layer 12.

Etching and removing the second insulating layer 13 to form the conductive layer 12 may include the following acts.

the second insulating layer 13 located in the multiple the first trenches T1 is removed by dry etching and using the first mask again, to expose the first insulating layer 9 and the sacrificial layer 11.

Wet transverse etching is performed through the first trench T1 to remove the sacrificial layer 11.

A first conductive thin film is deposited on the base substrate 1 on which the aforementioned structures are formed, and is ground to enable the first conductive thin film to be flush with the topmost first insulating layer 9; wherein the first conductive thin film may fill multiple the first trenches T1, or not completely fill the multiple the first trenches T1 but only covering the bottom walls and the sidewalls of the first trenches T1; the first conductive thin film completely replaces the sacrificial layer 11 removed by wet etched transversely, which may be understood that the first conductive thin film completely fills the space left after the removed sacrificial layer 11, and it is not necessary the first trench T1 is filled completely.

Figure 6:
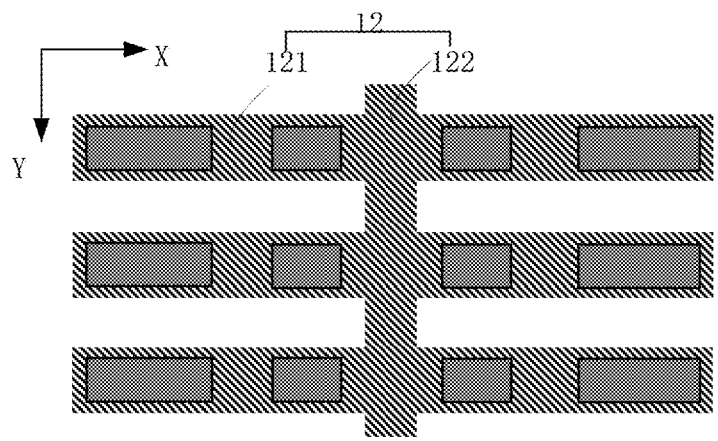
FIG. 6 is a cross-sectional view of a film layer on which a conductive layer is located in a direction parallel to the base substrate after the conductive layer is formed according to an exemplary embodiment.

Multiple first conductive thin films in the first trenches T1 are removed by dry etching and using the first mask again, and only the conductive layer in the space retained after the sacrificial layer 11 is etched, is retained to form a conductive layer 12; as shown in FIG. 6, FIG. 6 is a cross-sectional view of the film layer where the conductive layer 12 is located in a direction parallel to the base substrate 1 after the conductive layer in the first trench T1 is removed. The conductive layer 12 fills the region where the sacrificial layer 11 is located after the preset pattern is formed, and the orthographic projections of the conductive layer 12 and the first insulating layer 9 on the base substrate 1 overlap. The conductive layer 12 may include multiple first conductive portions 121 and a second conductive portion 122 connected with the first conductive portion 121, wherein, the first conductive portion 121 may extend along the first direction X, the second conductive portion 122 may extend along the second direction Y, the region where the first conductive portion 121 is located is the region where the first sub-portion 111 is located, and the region where the second conductive portion 122 is located is the region where the second sub-portion 112 is located. The first conductive portion 121 may subsequently form a first source/drain electrode 51 of the transistor and a first electrode 41 of the capacitor, and the second conductive portion 122 may subsequently form a second source/drain electrode 52 of the transistor, and form a bit line 30.

Alternatively, the first conductive portion 121 may subsequently form the first source/drain electrode 51 and the second source/drain electrode 52 of the transistor and the first electrode 41 of the capacitor, and the second conductive portion 122 may subsequently form the bit line 30.

In another exemplary embodiment, when the first trench T1 is not completely filled with the first conductive thin film, the first conductive thin film located in the first trench T1 may be removed by wet etching.

In embodiments, the first conductive thin film may be a conductive material as follows.

For example, the conductive material includes a met some al, such as, tungsten, aluminum, titanium, copper, nickel, platinum, ruthenium, molybdenum, gold, iridium, rhodium, tantalum, cobalt and the like; or it may be a metal alloy containing metals of the metals mentioned above.

Or, it may also be metal oxide, metal nitride, metal silicide and metal carbide, for example, a metal oxide material with high conductivity such as indium tin oxide (ITO), indium zinc oxide (IZO) and indium oxide (InO); for example, it is a metal nitride material such as titanium nitride (TiN), tantalum nitride (TaN), tungsten nitride (WN) and titanium aluminum nitride (TiAlN).

Or, for example, the conductive material may be a polysilicon material, a conductive doped semiconductor, or the like, such as, conductive doped silicon, conductive doped germanium, conductive doped silicon germanium, etc., or another material that shows conductivity, etc.

106) Forming a third insulating layer 14, etching and removing the dummy electrode 8 located in the first hole K1.

Forming the third insulating layer 14 and etching and removing the dummy electrode 8 in the first hole K1 may include the following acts.

A third insulating thin film is deposited on the base substrate 1 on which the aforementioned structures are formed and ground to form a third insulating layer 14; and the third insulating layer 14 is flush with the topmost first insulating layer 9.

The capacitor region 200 is opened by using the third mask, the third insulating layer 14 of the capacitor region 200 is etched and removed; that is, the third insulating layers 14 located in the multiple first trenches T1 of the capacitor region 200 are removed.

Figure 7:
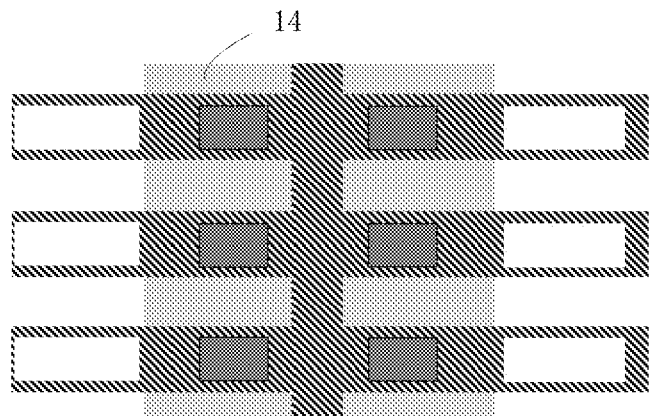
FIG. 7 is a cross-sectional view of a film layer on which the conductive layer is located in a direction parallel to the base substrate after the dummy electrode is removed in the first hole according to an exemplary embodiment.

The dummy electrode 8 located in the first hole K1 is removed by wet etching, as shown in FIG. 7, which is a cross-sectional view of the film layer where the conductive layer 12 is located in a direction parallel to the base substrate 1 after the dummy electrode 8 in the first hole K1 is removed.

In some embodiments, the third insulating thin film may be a low-K dielectric layer including but not limited to a silicon oxide such as silicon dioxide ($SiO_2$), etc.

107) Forming a dielectric layer 43, a second electrode 42 and a fifth insulating layer 16.

On the basis of removing the third insulating layer 14 of the capacitor region 200 by etching; that is, removing the third insulating layers 14 located in the multiple first trenches T1 of the capacitor region 200 and removing, by wet etching, the dummy electrode 8 located in the first hole K1, forming the dielectric layer 43, the second electrode 42 and the fifth insulating layer 16 may include the following acts.

A dielectric thin film and a conductor material are sequentially deposited on the base substrate 1 on which the aforementioned structures are formed, and a dielectric layer 43 and a second electrode 42 are deposited respectively, such that the semiconductor structure includes a dielectric layer distributed in the first hole K1 and extending only from the topmost storage cell into the first trench T1, and a second electrode of a capacitor distributed in the first hole K1 and extending only from the topmost storage cell into the first trench T1.

The dielectric layer 43 covers a region exposed by the conductive layer 12, i.e., a sidewall and a bottom wall of the first hole K1, and the end face of the first conductive portion 21 away from the second conductive portion 122 and the two sidewalls, extending in the direction perpendicular to the base substrate 1, of which the distances from the end face are less than or equal to a preset distance. The second electrode 42 fills the first hole K1 and multiple first trenches T1 located in the capacitor region 200, and the second electrode 42 is insulated from the first conductive portion 121 through the dielectric layer 43. The second electrode 42 wraps an end face of a side of the first conductive portion 121 away from the second conductive portion 122 and two sidewalls, extending in a direction perpendicular to the base substrate 1, of which distances from the end face are less than or equal to a preset distance. That is, the second electrode 42 wraps an end face of a side of the first electrode 41 away from the second conductive portion 122 and two sidewalls which are adjacent to the end face and extend in the direction perpendicular to the base substrate 1.

The third mask is used again, the dielectric layer 43 and the second electrode 42 located in the transistor region 100 are etched and removed, the etching stops on the topmost first insulating layer 9, and an upper surface (a surface on a side away from the base substrate 1) of the dummy electrode 8 deposited in the second hole K2 is exposed.

Figure 8A:
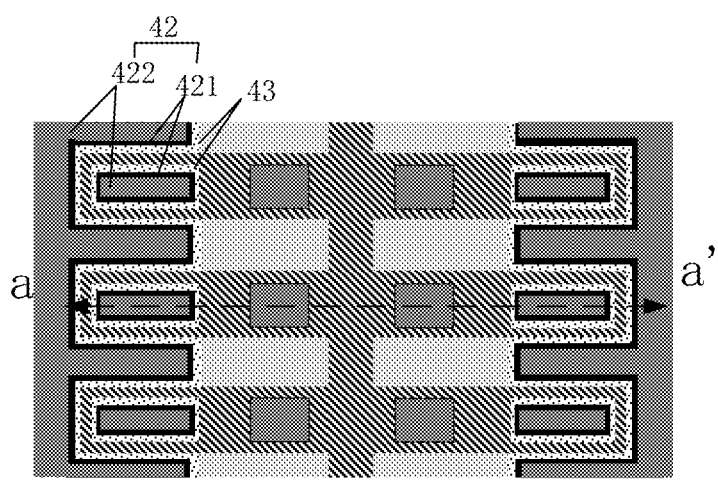
FIG. 8A is a cross-sectional view (a film layer on which the conductive layer is located) in a direction parallel to the base substrate after an dielectric layer, a second electrode and a fifth insulating layer are formed according to an exemplary embodiment.
Figure 8B:
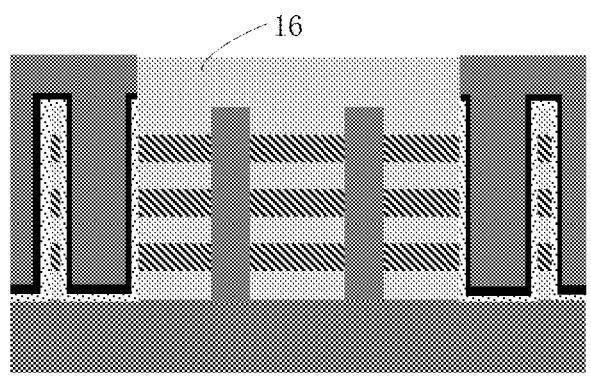
FIG. 8B is a cross-sectional view in the aa' direction after the dielectric layer, the second electrode, and the fifth insulating layer are formed according to an exemplary embodiment.

A fifth insulating thin film is deposited and grinded to form a fifth insulating layer 16 covering the transistor region 100, as shown in FIGS. 8A and 8B. FIG. 8A is a schematic cross-sectional view (the thin film where the conductive layer 12 is located) in a direction parallel to the base substrate 1 after the dielectric layer 43, the second electrode 42 and the fifth insulating layer 16 are formed according to an exemplary embodiment, and FIG. 8B is a schematic view in the aa' direction of FIG. 8A, when ground, the surface of a side of the fifth insulating layer 16 away from the base substrate 1 is flush with the surface of a side of the second electrode 42 away from the base substrate 1. As shown in FIG. 8A, it may be seen that the second electrode 42 may include an inner electrode disposed in each of the first holes K1, and an outer electrode wrapping the end face and two sidewalls of the first Pole 41. The outer electrode wraps the entire region of the two sidewalls. As shown in FIG. 8B, the inner and outer electrodes may be connected at the top of the semiconductor device, they are connected by a planar film layer extending in a direction parallel to the base substrate at the top, and the planar film layer has an opening exposing the transistor region 100.

In some embodiments, the second electrode 42 may include a first sub-layer 421 and a second sub-layer 422. After the dielectric layer 43 is formed, a first sub-conductive thin film may be deposited on the base substrate 1 to form the first sub-layer 421; a second sub-conductive thin film may be then deposited to form a second sub-layer 422 which fills a first hole K1 and multiple first trenches T1 located in the capacitor region 200. The first sub-layer 421 covers the dielectric layer 43, and the second sub-layer 422 covers the first sub-layer 421. The second sub-layer 422 is connected to the first sub-layer 421.

In some embodiments, the dielectric thin film and conductor material may be deposited by Atomic Layer Deposition (ALD).

In some embodiments, the dielectric thin film may be a High-K dielectric material, i.e., a dielectric material with a dielectric constant K≥3.9. In some embodiments, one or more oxides of hafnium, aluminum, lanthanum, zirconium and the like may be included. Exemplary, it may include but not limited to at least one of the following High K materials: hafnium oxide ($HfO_2$), alumina ($Al_2O_3$), hafnium aluminum oxide (HfAlO), hafnium lanthanum oxide (HfLaO), and zirconium oxide ($ZrO_2$).

In some embodiments, the first sub-conductive thin film includes but is not limited to at least one or any combination of the following: metal or alloy, for example, a metal including tungsten, aluminum, titanium, copper, nickel, platinum, ruthenium, molybdenum, gold, iridium, rhodium, tantalum, cobalt and the like; or it may be a metal alloy containing metals of these metals mentioned above.

Alternatively, it may be a metal oxide, a metal nitride, a metal silicide, a metal carbide, etc., such as tin-doped indium oxide (ITO), indium-doped zinc oxide (IZO), indium oxide (InO), aluminum-doped zinc oxide (AZO), iridium oxide (IrOx), ruthenium oxide (RuOx) and other metal oxide conductive materials; for example, titanium nitride (TiN), tantalum nitride (TaN), tungsten nitride (WN), titanium aluminum nitride (TiAlN) and other metal nitride materials.

In some embodiments, the second sub-conductive thin film includes, but is not limited to, a metal, a metal alloy, polysilicon, a silicon doped conductive layer, a metal oxide conductive layer, and the like. The first sub-conductive thin film may be a film layer having better adhesion performance than the second sub-conductive thin film, to enhance adhesion between the second electrode 42 and the dielectric layer 43.

In some embodiments, the fifth insulating thin film may be a low-K dielectric layer including but not limited to a silicon oxide such as silicon dioxide ($SiO_2$), etc.

108) Forming a second trench T2.

Figure 9A:
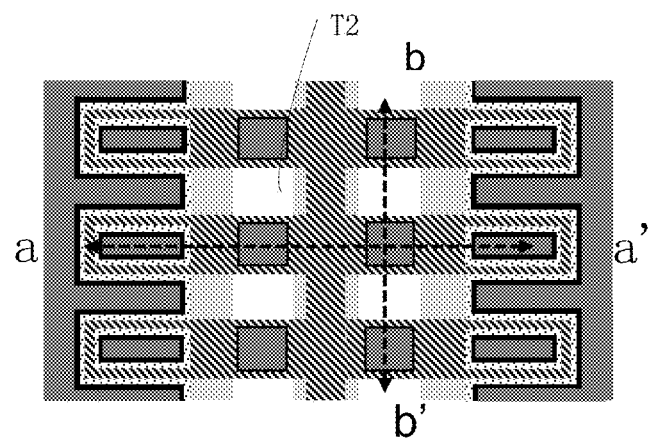
FIG. 9A is a cross-sectional view of a film layer on which a conductive layer is located in a direction parallel to the base substrate after a second trench is formed according to an exemplary embodiment.
Figure 9B:
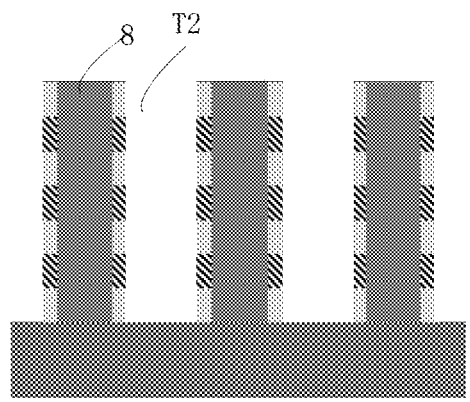
FIG. 9B is a cross-sectional view in the bb' direction in FIG. 9A.

Forming the second trench T2 may include: opening the region where the second trench T2 is located by using a fourth mask, and etching from the top layer to the bottom layer (excluding the base substrate 1) by using dry etching, to form the second trench T2; as shown in FIGS. 9A and 9B, wherein, FIG. 9A is a cross-sectional view of the film layer where the conductive layer 12 is located in a direction parallel to the base substrate 1 after the second trench T2 is formed; and FIG. 9B is a cross-sectional view in the direction bb' in FIG. 9A.

The second trench T2 exposes a sidewall of the first conductive portion 121 close to the second hole K2, and a size of the second trench T2 along the extending direction of the first conductive portion 121 is larger than a size of the second hole K2 along the extending direction of the first conductive portion 121, so as to facilitate subsequent etching of the conductive layer 12 to expose the sidewall of a side of the dummy electrode 8 towards the second trench T2. The second trench T2 does not expose the second conductive portion 122. The second trench T2 is located in the transistor region 100 and outside the capacitor region 200.

109) Etching the conductive layer 12.

Figure 10A:
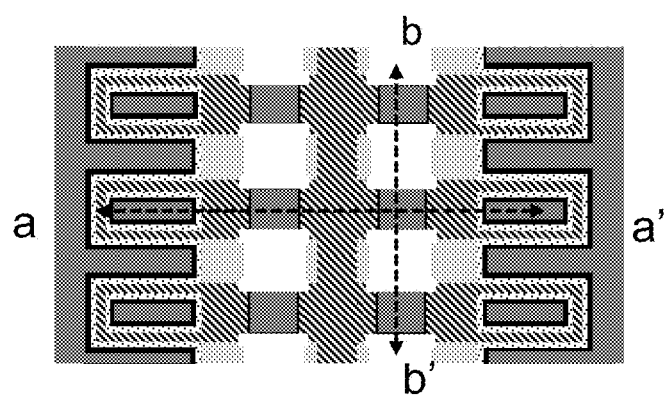
FIG. 10A is a cross-sectional view of a film layer on which the conductive layer is located in a direction parallel to the base substrate after the conductive layer is etched according to an exemplary embodiment.
Figure 10B:
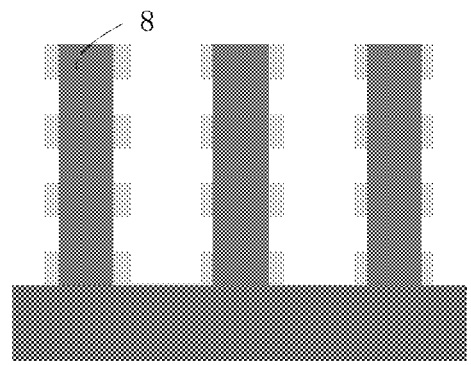
FIG. 10B is a cross-sectional view in the bb' direction in FIG. 10A.

Etching the conductive layer 12 may include: etching the conductive layer 12 transversely by wet etching through the second trench T2 to expose the sidewall of a side of the dummy electrode 8 towards the second trench T2, in this case the region of the second trench T2 in the conductive layer 12 is enlarged; the sidewall of the side of the dummy electrode 8 towards the second trench T2 is completely exposed, and a size of the etched region of the first conductive portion 121 in the extending direction of the first conductive portion 121 is larger than a size of the second hole K2 in the extending direction of the first conductive portion 121, so that the first source/drain electrode 51 and the second source/drain electrode 52 are disconnected, as shown in FIG. 10A and FIG. 10B, wherein FIG. 10A is a cross-sectional view of the film layer where the conductive layer 12 is located along the direction parallel to the substrate 1 after the conductive layer 12 is etched; and FIG. 10B is a cross-sectional view in the bb' direction in FIG. 10A.

110) Forming a barrier layer 7.

Figure 11A:
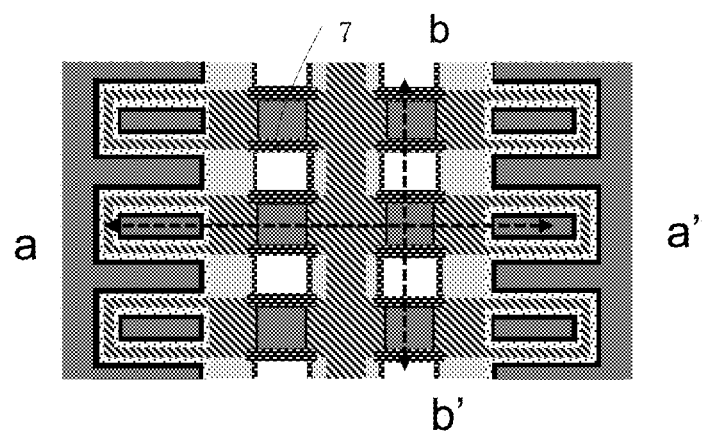
FIG. 11A is a cross-sectional view of a film layer on which the conductive layer is located in a direction parallel to the base substrate after a barrier layer is formed according to an exemplary embodiment.
Figure 11B:
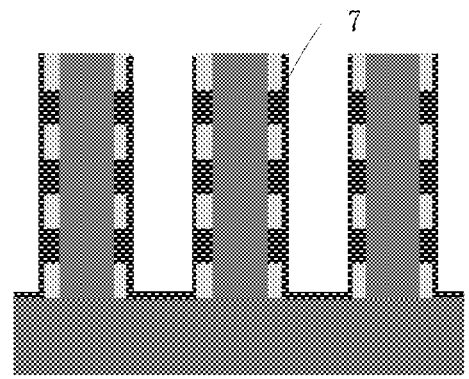
FIG. 11B is a cross-sectional view in the bb' direction in FIG. 11A.

Forming the barrier layer 7 may include: depositing a barrier layer thin film on the base substrate 1 on which the aforementioned structures are formed, and grinding it to form the barrier layer 7; wherein the barrier layer 7 covers the bottom wall and the sidewall of the second trench T2 and does not completely fill the second trench T2, that is, the barrier layer 7 with a preset thickness is covered on the bottom wall and the sidewall, and the barrier layer 7 has an opening with a direction towards a side away from the base substrate 1, as shown in FIGS. 11A and 11B, wherein, FIG. 11A is a cross-sectional view of the film layer where the conductive layer 12 is located in the direction parallel to the base substrate 1 after the barrier layer 7 is formed; and FIG. 11B is a cross-sectional view in the bb' direction in FIG. 11A.

In some embodiments, the barrier layer thin film may be a low-K dielectric layer different from the first insulating thin film, such as nitrogen-doped or carbon-doped silicon dioxide or the like. There is a high etching selectivity ratio between the barrier layer 7 and the dummy electrode 8, which facilitates protecting other film layers when the dummy electrode 8 in the second hole K2 is etched subsequently.

111) Forming a fourth insulating layer 15.

Figure 12A:
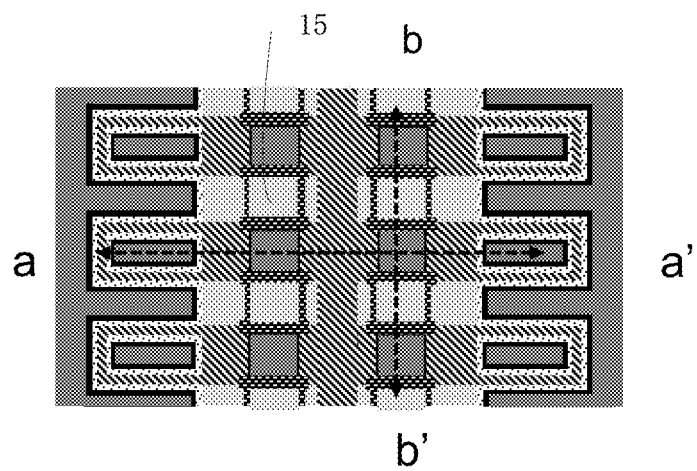
FIG. 12A is a cross-sectional view of a film layer on which the conductive layer is located in a direction parallel to the base substrate after a fourth insulating layer is formed according to an exemplary embodiment.
Figure 12B:
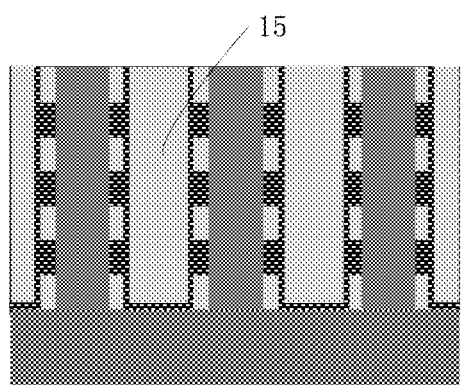
FIG. 12B is a cross-sectional view in the bb' direction in FIG. 12A.

Forming the fourth insulating layer 15 may include: depositing a fourth insulating thin film in the second trench T2 and grinding it to form the fourth insulating layer 15 filling the second trench T2, wherein a surface of the fourth insulating layer 15 on the side away from the base substrate 1 is flush with a surface of the topmost first insulating layer 9 on the side away from the base substrate 1, as shown in FIGS. 12A and 12B, wherein FIG. 12A is a cross-sectional view of the film layer where the conductive layer 12 is located in a direction parallel to the base substrate 1 after the formation of the fourth insulating layer 15; and FIG. 12B is a cross-sectional view in the bb' direction in FIG. 12A.

112) Removing the dummy electrode 8 located in the second hole K2.

Figure 13A:
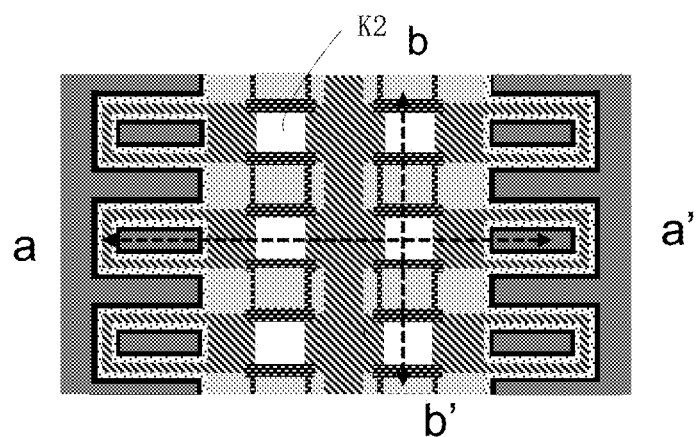
FIG. 13A is a cross-sectional view of a film layer on which the conductive layer is located in a direction parallel to the base substrate after the dummy electrode is removed according to an exemplary embodiment.
Figure 13B:
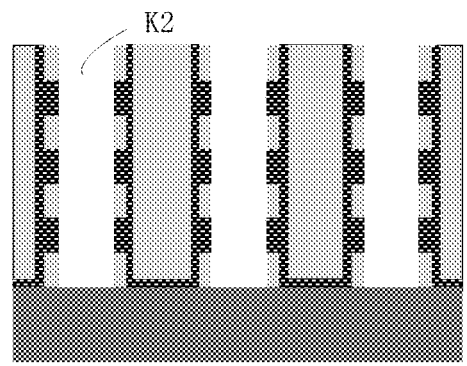
FIG. 13B is a cross-sectional view in the bb' direction in FIG. 13A.

Removing the dummy electrode 8 located in the second hole K2 may include: removing the dummy electrode 8 located in the second hole K2 by wet etching, as shown in FIGS. 13A and 13B, wherein, FIG. 13A is a cross-sectional view of the film layer where the conductive layer 12 is located along the direction parallel to the base substrate 1 after the dummy electrode 8 is removed; and FIG. 13B is a cross-sectional view in the bb' direction in FIG. 13A. After the dummy electrode 8 in the second hole K2 is removed, the semiconductor layer 23, the gate insulating layer 24, and the word line 40 may be formed in the second hole K2.

113) Etching the first insulating layer 9.

Figure 14A:
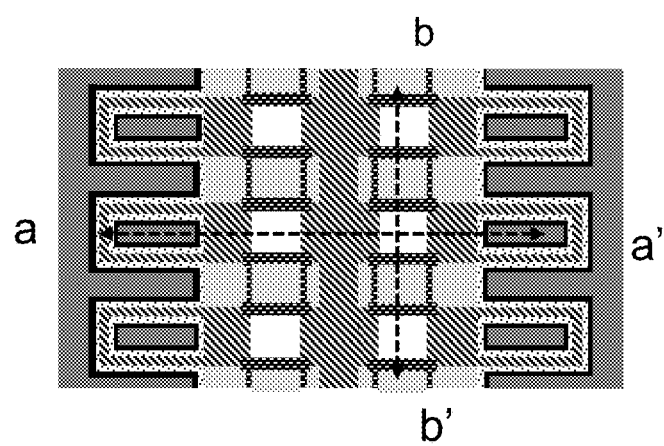
FIG. 14A is a cross-sectional view of a film layer on which the conductive layer is located in a direction parallel to the base substrate after a first insulating layer is etched according to an exemplary embodiment.
Figure 14B:
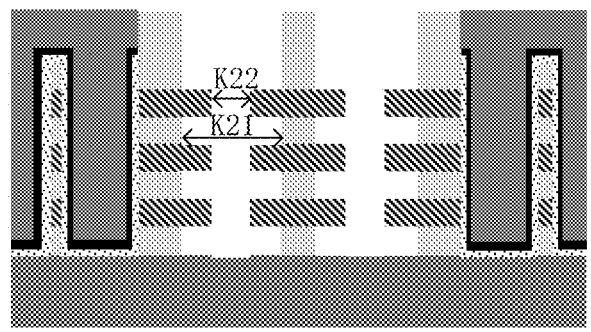
FIG. 14B is a cross-sectional view in the aa' direction in FIG. 14A.
Figure 14C:
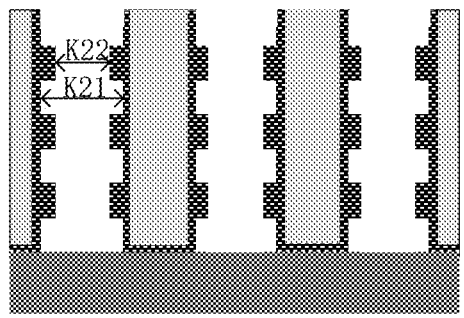
FIG. 14C is a cross-sectional view in the bb' direction in FIG. 14A.

Etching the first insulating layer 9 may include: performing wet transverse etching on the first insulating layer 9 such that an aperture of the second sub-hole K22, located on the conductive layer 12, of the second hole K2 is smaller than an aperture of the first sub-hole K21, located on the first insulating layer 9, of the second hole K2, so as to facilitate subsequent etching of the semiconductor layer 23 between transistors outside the second hole K2 and eliminate parasitic transistors, as shown in FIGS. 14A, 14B and 14C, wherein, FIG. 14A is a cross-sectional view of the film layer where the conductive layer 12 is located in a direction parallel to the base substrate 1 after the first insulating layer 9 is etched, FIG. 14B is a cross-sectional view along the aa' direction in FIG. 14A, and FIG. 14C is a cross-sectional view in the bb' direction in FIG. 14A. In the bb' direction, the etching of the first insulating layer 9 stops at the barrier layer 7, so that the size of the second hole K2 in the bb' direction may be defined by the barrier layer 7, and accurate control of the second hole K2 can be achieved.

In some embodiments, a first width of the first insulating layer 9 transversely etched in a direction parallel to the aa' direction may be greater than a second width of the first insulating layer 9 transversely etched in a direction parallel to the bb' direction, i.e., more etching amount in the direction parallel to the aa' direction, less etching amount in the direction parallel to the bb' direction. More etching amount is in the aa' direction, so when the semiconductor layer 23 needs to be exposed later, less first insulating layer 9 needs to be etched away, so that the process is more simpler. Less etching amount is in bb' direction, so the device size can be reduced and the device density can be increased.

114) Forming the semiconductor layer 23, the gate insulating layer 24 and the word line 40.

Figure 15A:
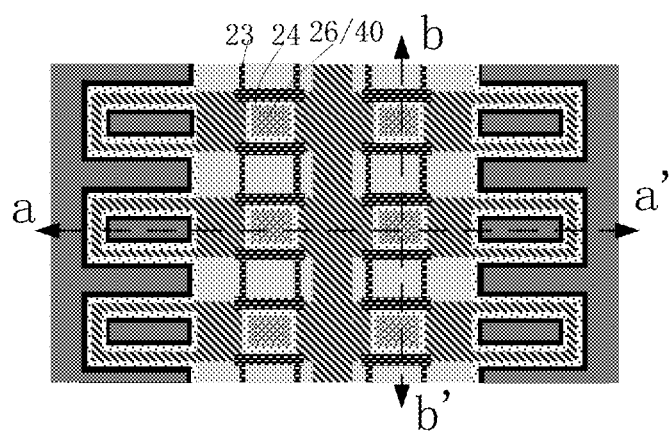
FIG. 15A is a cross-sectional view (a film layer on which a conductive layer is located) in a direction parallel to the base substrate after a semiconductor layer, a gate insulating layer, and a word line are formed according to an exemplary embodiment.
Figure 15B:
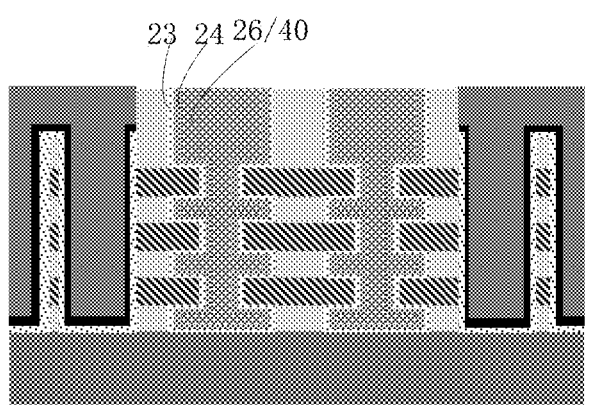
FIG. 15B is a cross-sectional view in the aa' direction in FIG. 15A.
Figure 15C:
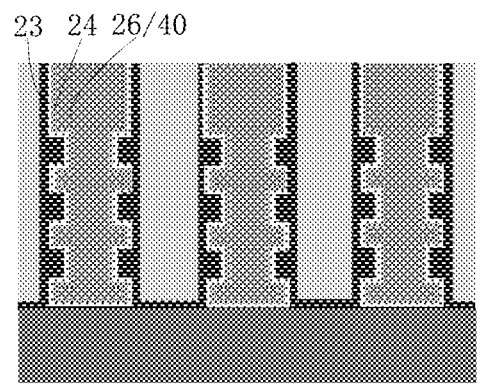
FIG. 15C is a cross-sectional view in the bb' direction in FIG. 15A.

Forming the semiconductor layer 23, the gate insulating layer 24, and the word line 40 may include: sequentially depositing a semiconductor thin film, a gate insulating thin film, and a gate electrode thin film on the base substrate 1 on which the aforementioned structures are formed, and grinding them to form the semiconductor layer 23, the gate insulating layer 24, and the word line 40; as shown in FIG. 15A, FIG. 15B, and FIG. 15C, wherein FIG. 15A is a cross-sectional view (the film layer where the conductive layer 12 is located) in a direction parallel to the base substrate 1 after the semiconductor layer 23, the gate insulating layer 24, and the word line 40 are formed, FIG. 15B is a cross-sectional view in the aa' direction in FIG. 15A, and FIG. 15C is a cross-sectional view in the bb' direction in FIG. 15A. The gate electrodes 26 of each layer of transistors are a part of the word line 40.

The semiconductor layer 23 may cover the bottom wall and the sidewall of the second hole K2, the word line 40 fills the second hole K2, and the gate insulating layer 24 is disposed between the semiconductor layer 23 and the word line 40, such that the semiconductor layer 23 and the word line 40 are insulated.

In some embodiments, the semiconductor thin film, the gate insulating thin film, and the gate electrode thin film may be deposited by ALD.

In an exemplary embodiment of the present disclosure, a material of the semiconductor layer 23 may be a material such as silicon or polysilicon with a band gap less than 2 eV, or a material with a wide band gap, such as a metal oxide material with a band gap greater than 2 eV.

For example, the material of the metal oxide semiconductor layer or channel may include a metal oxide of at least one of the following metals: indium, gallium, zinc, tin, tungsten, magnesium, zirconium, aluminum, hafnium and the like. Of course, compounds containing other elements, such as N, Si and other elements, are not excluded from the metal oxide; and a small amount of other doping elements are also not excluded from the metal oxide.

In some embodiments, the material of the metal oxide semiconductor layer or channel may include one or more of the followings: indium gallium zinc oxide (InGaZnO), indium zinc oxide (InZnO), indium gallium oxide (InGaO), indium tin oxide (InGaSnO), indium gallium tin oxide (InGaZnSnO), indium oxide (InO), tin oxide (SnO), zinc tin oxide (ZnSnO, ZTO), indium aluminum zinc gold oxide (InAlZnO), zinc oxide (ZnO), indium gallium silicon oxide (InGaSiO), indium tungsten oxide (InWO, IWO), titanium oxide (TiO), zinc nitride (ZnON), magnesium zinc oxide (MgZnO), zirconium indium zinc oxide (ZrInZnO), hafnium indium zinc oxide (HfInZnO), tin indium zinc oxide (SnInZnO), aluminum tin indium zinc oxide (AlSnInZnO), silicon indium zinc oxide (SiInZnO), aluminum zinc tin oxide (AlZnSnO), gallium zinc tin oxide (GaZnSnO), zirconium zinc tin oxide (ZrZnSnO) and the like, the specific adjustment may be performed according to the actual situations as long as it is ensured that the drain current of the transistor meets the requirements.

These materials have a wide band gap and a low leakage current. For example, when the metal oxide material is IGZO, the leakage current of the transistor is less than or equal to $10^{-15}$ A, thereby improving the working performance of the dynamic memory.

The material of the metal oxide semiconductor layer or channel only emphasizes the element type of the material, and does not emphasize the atomic proportion in the material and the thin film quality of the material.

In an exemplary embodiment of the present disclosure, the material of the gate insulating layer 24 may include one or more layers of High-K dielectric material. In some embodiments, one or more oxides of hafnium, aluminum, lanthanum, zirconium and the like may be included. Exemplary, it may include but not limited to at least one of the following High K materials: hafnium oxide ($HfO_2$), alumina ($Al_2O_3$), hafnium aluminum oxide (HfAlO), hafnium lanthanum oxide (HfLaO), zirconium oxide ($ZrO_2$).

In some embodiments, the gate electrode thin film may be one or more of the following different types of materials.

For example, it is a metal, such as tungsten, aluminum, titanium, copper, nickel, platinum, ruthenium, molybdenum, gold, iridium, rhodium, tantalum, cobalt and the like; or it may be a metal alloy containing metals of these metals mentioned above.

Alternatively, it may be a metal oxide, a metal nitride, a metal silicide, a metal carbide, etc., for example a metal oxide material with high conductivity, such as indium tin oxide (ITO), indium zinc oxide (IZO), indium oxide (InO), Aluminum doped Zinc Oxide (AZO); for example, a metal nitride material, such as titanium nitride (TiN), tantalum nitride (TaN), tungsten nitride (WN) and titanium aluminum nitride (TiAlN).

Alternatively, for example, it may be a polysilicon material, a conductive doped semiconductor, or the like, such as, conductive doped silicon, conductive doped germanium, conductive doped silicon germanium, etc., or another material that shows conductivity, etc.

Figure 16A:
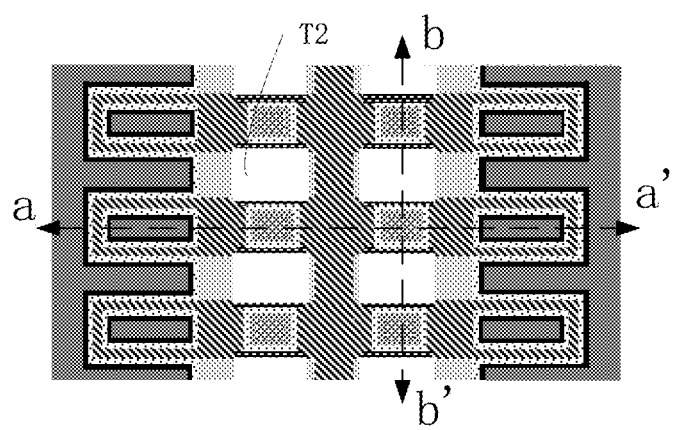
FIG. 16A is a cross-sectional view (a film layer on which the conductive layer is located) in a direction parallel to the base substrate after a semiconductor layer is exposed according to an exemplary embodiment.
Figure 16B:
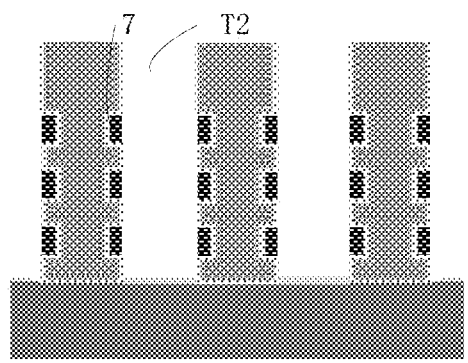
FIG. 16B is a cross-sectional view in the bb' direction in FIG. 16A.

115) Exposing a sidewall of the semiconductor layer 23 located in the first sub-hole K21 and connected to the barrier layer 7;

Exposing the sidewall of the semiconductor layer 23 located in the first sub-hole K21 and connected to the barrier layer 7 may include: removing the fourth insulating layer 15 in the second trench T2 by dry etching, and removing a part of the barrier layer 7 by dry etching, and exposing the sidewall of the semiconductor layer 23 located in the first sub-hole K21 and connected to the barrier layer 7 (after the barrier layer 7 is etched and removed, the sidewall of the exposed semiconductor layer 23 is not connected with the barrier layer 7), wherein the sidewall of the exposed semiconductor layer 23 is parallel to the extending direction of the first conductive part 121. In this case, the semiconductor layer 23 located in the second sub-hole K22 is protected by the barrier layer 7, as shown in FIGS. 16A and 16B, wherein, FIG. 16A is a cross-sectional view (the film layer where the conductive layer 12 is located) in a direction parallel to the base substrate 1 after the semiconductor layer 23 is exposed, and FIG. 16B is a cross-sectional view in the bb' direction in FIG. 16A. In this case, the semiconductor layer 23 located in the first sub-hole K21 is only partially exposed and two sidewalls are not exposed. In addition, the barrier layer 7 retains only the sidewalls parallel to the aa' direction, and the sidewalls perpendicular to the aa' direction are etched away as shown in FIG. 16A.

116) Exposing a sidewall of the semiconductor layer 23 located in the first sub-hole K21 and connected to the first insulating layer 9.

Figure 17A:
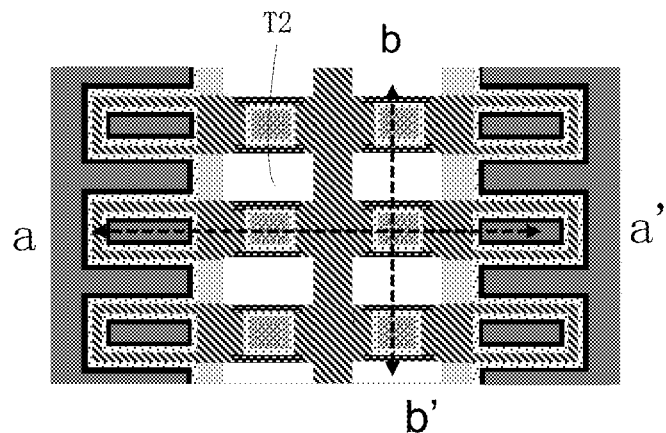
FIG. 17A is a cross-sectional view (a film layer on which the conductive layer is located) in a direction parallel to the base substrate after a semiconductor layer is exposed according to an exemplary embodiment.
Figure 17B:
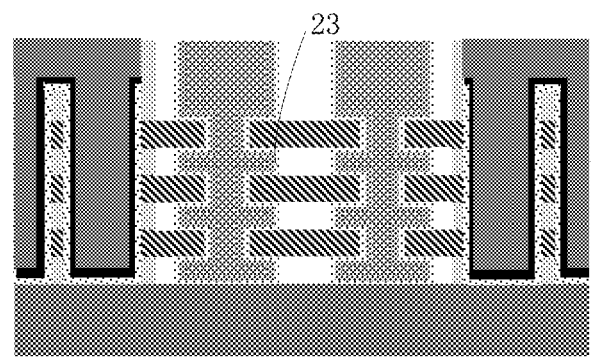
FIG. 17B is a cross-sectional view in the aa' direction in FIG. 17A.
Figure 17C:
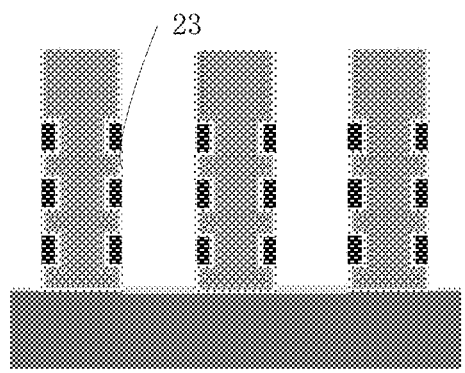
FIG. 17C is a cross-sectional view in the bb' direction in FIG. 17A.

Exposing the sidewall of the semiconductor layer 23 located in the first sub-hole K21 and connected to the first insulating layer 9 may include: wet etching the first insulating layer 9 through a second trench T2 (the fourth insulating layer 15 in the second trench T2 is removed in the previous act), exposing the sidewall of the semiconductor layer 23 located in the first sub-hole K21 and connected to the first insulating layer 9; as shown in FIGS. 17A, 17B and 17C, FIG. 17A is a cross-sectional view (the film layer where the conductive layer 12 is located) in a direction parallel to the base substrate 1 after the semiconductor layer 23 is exposed, FIG. 17B is a cross-sectional view in the aa' direction in FIG. 17A, and FIG. 17C is a cross-sectional view in the bb' direction in FIG. 17A. In this case, the semiconductor layers 23 located in the first sub-hole K21 are all exposed. The semiconductor layer 23 located in the second sub-hole K22 is not exposed.

117) Etching and removing the semiconductor layer 23 located in the first sub-hole K21.

Etching and removing the semiconductor layer 23 located in the first sub-hole K21 may include: removing the semiconductor layer 23 located in the first sub-hole K21 by wet etching; wherein the semiconductor layers 23 of different layers are disconnected.

Figure 18A:
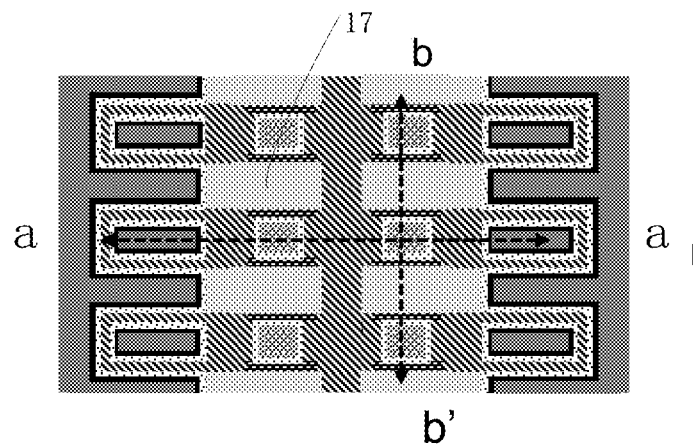
FIG. 18A is a cross-sectional view (a film layer on which the conductive layer is located) in a direction parallel to the base substrate after a semiconductor layer is etched according to an exemplary embodiment.
Figure 18B:
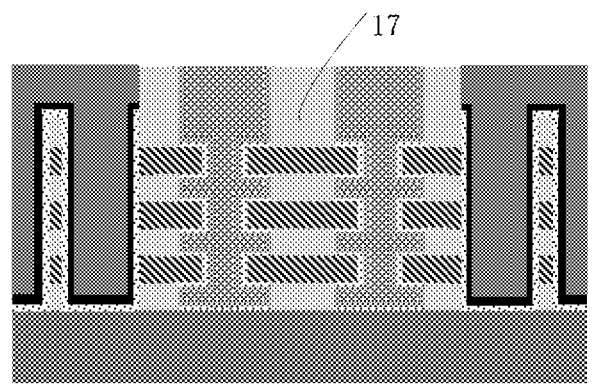
FIG. 18B is a cross-sectional view in the aa' direction in FIG. 18A.
Figure 18C:
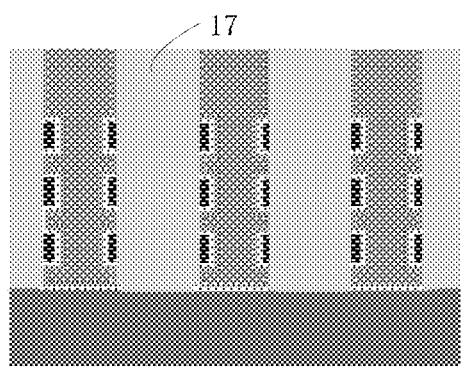
FIG. 18C is a cross-sectional view in the bb' direction in FIG. 18A.

A sixth insulating thin film is deposited on the base substrate 1 on which the aforementioned structures are formed, and is ground to form a sixth insulating layer 17; and the sixth insulating layer 17 fills the second trench T2, the first insulating layer 9, and the etched region of the semiconductor layer 23, as shown in FIGS. 18A, 18B and 18C, wherein, FIG. 18A is a cross-sectional view (the film layer where the conductive layer 12 is located) in a direction parallel to the base substrate 1 after the semiconductor layer 23 is etched, FIG. 18B is a cross-sectional view in the aa' direction in FIG. 18A, and FIG. 18C is a cross-sectional view in the bb' direction in FIG. 18A.

In some embodiments, the sixth insulating thin film may be a low-K dielectric layer including but not limited to a silicon oxide such as silicon dioxide ($SiO_2$), etc.

In the method for manufacturing the semiconductor device provided by the embodiment, stacking of insulating layers and sacrificial layers is used to replace the stacking of insulating layers and conductive layers, thereby facilitating the etching of a multilayer structure with a high aspect ratio, reducing the process difficulty and the cost. In addition, the mask pattern or masks may be reused, thus reducing the number of masks used and the cost. In addition, the pattern of the capacitor and the pattern of the hole perpendicular to the transistor are formed in one process, so that multiple etchings are avoided. The capacitor includes an inner electrode and an outer electrode, when the total length of the capacitor is constant, the area of the capacitor is increased and the capacitance is increased. In addition, removing the parasitic channel from the outside of the channel is simpler than removing the parasitic channel from the inside of the channel, and is less prone to damage the channel, thus improving the device performance.

In another exemplary embodiment, a contact layer may be provided between the semiconductor layer 23, the first source/drain electrodes 51, and the second source/drain electrodes 52 to reduce the contact resistances between the semiconductor layer 23 and the first source/drain electrodes 51 and between the semiconductor layer 23 and the second source/drain electrodes 52.

In an exemplary embodiment, the manufacturing process of the semiconductor device may include the following acts 201) to 220).

201) to 212) are the same as acts 101) to 112).

213) Transversely etching the conductive layer 12.

Figure 19A:
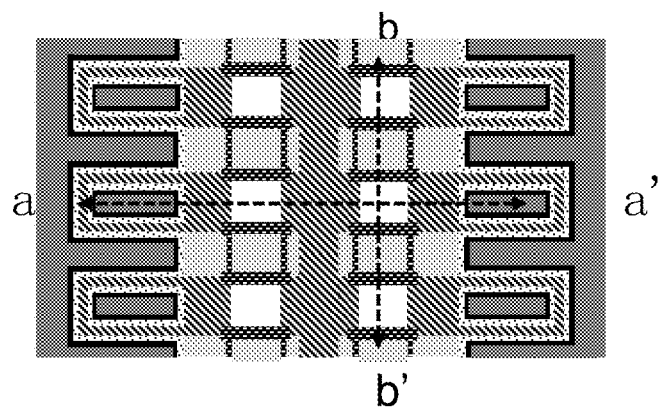
FIG. 19A is a cross-sectional view (a film layer on which the conductive layer is located) in a direction parallel to the base substrate after a conductive layer is transversely etched according to an exemplary embodiment.
Figure 19B:
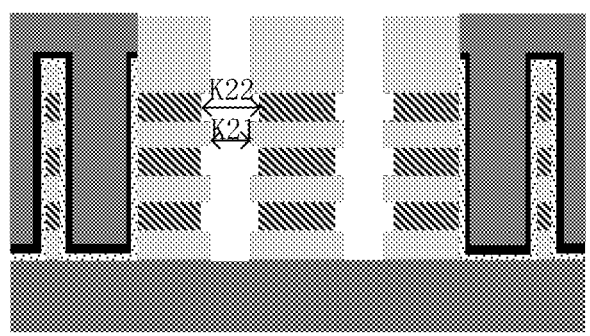
FIG. 19B is a cross-sectional view in the aa' direction in FIG. 19A.
Figure 19C:
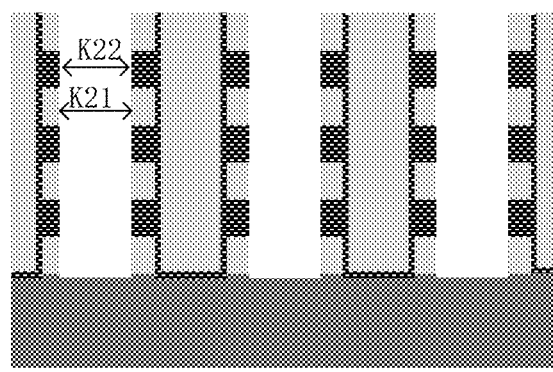
FIG. 19C is a cross-sectional view in the bb' direction in FIG. 19A.

The transversely etching the conductive layer 12 may include: transversely etching the conductive layer 12 in a preset width along a direction parallel to the extension direction of the first source/drain electrode 51, such that an aperture of the second sub-hole K22 along the direction parallel to the extension direction of the first source/drain electrode 51 is enlarged (larger than an aperture of the first sub-hole K21 along the direction parallel to the extension direction of the first source/drain electrode 51), and an aperture of the second sub-hole K22 along a direction perpendicular to the extension direction of the first source/drain electrode 51 remains unchanged (consistent with an aperture of the first sub-hole K21 along the direction perpendicular to the extension direction of the first source/drain electrode 51), as shown in FIGS. 19A, 19B, and 19C, wherein, FIG. 19A is a cross-sectional view (the film layer where the conductive layer 12 is located) along a direction parallel to the base substrate 1 after the conductive layer 12 is transversely etched, FIG. 19B is a cross-sectional view in the aa' direction in FIG. 19A, and FIG. 19C is a cross-sectional view in the bb' direction in FIG. 19A. The preset width may be set according to a width of the contact layer 6, and the contact layer 6 is provided in the etched region of the conductive layer 12 subsequently.

214) Forming a contact layer 6.

Figure 20A:
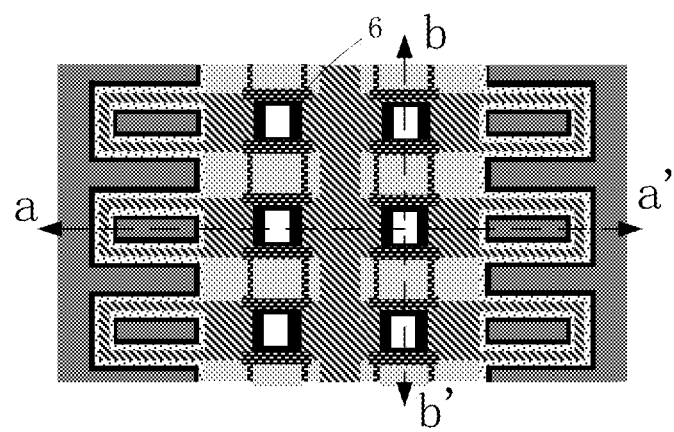
FIG. 20A is a cross-sectional view (a film layer on which the conductive layer is located) in a direction parallel to the base substrate after a contact layer is formed according to an exemplary embodiment.
Figure 20B:
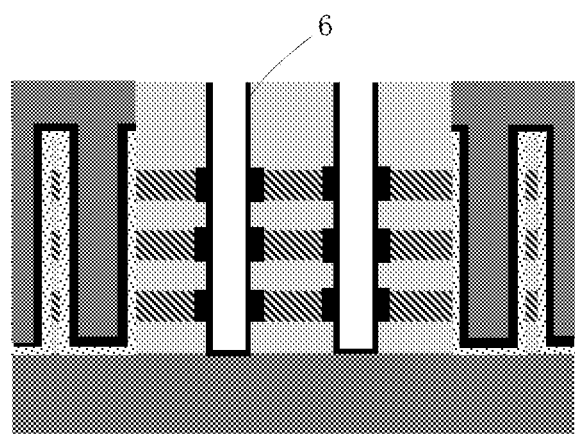
FIG. 20B is a cross-sectional view in the aa' direction in FIG. 20A.
Figure 20C:
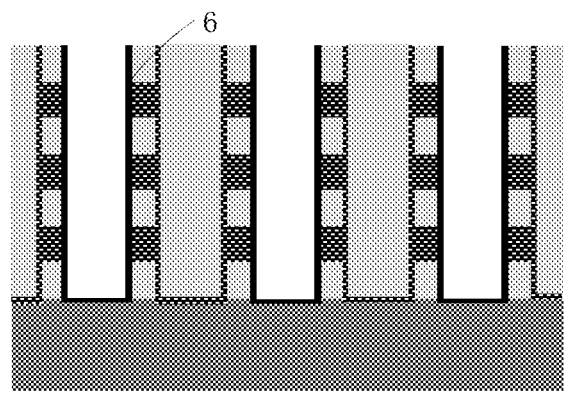
FIG. 20C is a cross-sectional view in the bb' direction in FIG. 20A.

Forming the contact layer 6 may include: depositing a third conductive thin film on the base substrate 1 on which the aforementioned structures are formed, forming the contact layer 6 covering the bottom wall and the sidewall of the second hole K2, as shown in FIGS. 20A, 20B and 20C, wherein, FIG. 20A is a cross-sectional view (the film layer where the conductive layer 12 is located) in a direction parallel to the base substrate 1 after the formation of the contact layer 6, FIG. 20B is a cross-sectional view in the aa' direction in FIG. 20A, and FIG. 20C is a cross-sectional view in the bb' direction in FIG. 20A.

In some embodiments, the third conductive thin film may include but is not limited to a material such as TiN that has a small contact resistance with the semiconductor layer 23.

215) Etching a part of the contact layer 6.

Figure 21A:
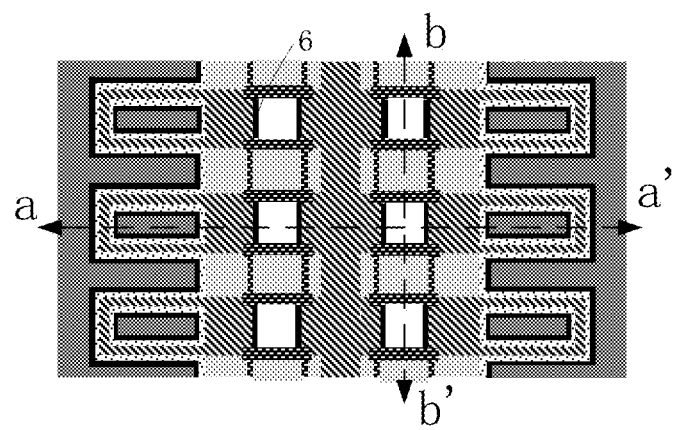
FIG. 21A is a cross-sectional view (a film layer on which the conductive layer is located) in a direction parallel to the base substrate after a portion of the contact layer is etched according to an exemplary embodiment.
Figure 21B:
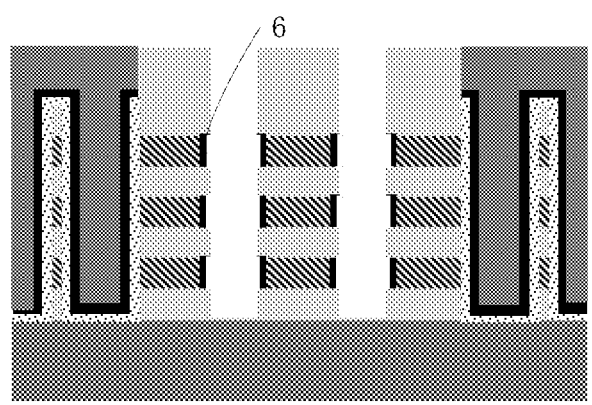
FIG. 21B is a cross-sectional view in the aa' direction in FIG. 21A.
Figure 21C:
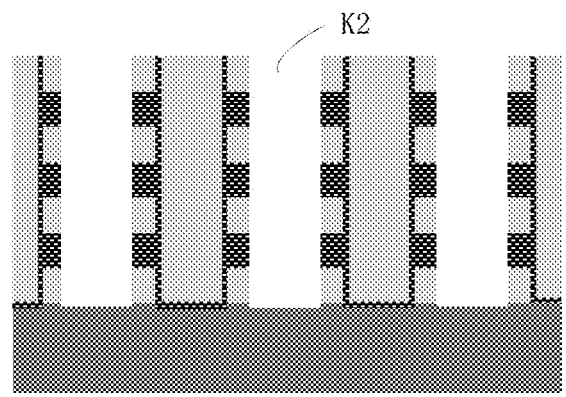
FIG. 21C is a cross-sectional view in the bb' direction in FIG. 21A.

Etching the part of the contact layer 6 may include: dry etching the contact layer 6, leaving only the contact layer 6 located on the sidewall of the conductive layer 12, and removing the contact layer 6 located on the remaining sidewall and the bottom wall in the second hole K2, as shown in FIGS. 21A, 21B and 21C, wherein FIG. 21A is a cross-sectional view (the film layer where the conductive layer 12 is located) in a direction parallel to the base substrate 1 after a part of the contact layer 6 is etched, FIG. 21B is a cross-sectional view in the aa' direction in FIG. 21A, and FIG. 21C is a cross-sectional view in the bb' direction in FIG. 21A. It may be seen that, in the cross-sectional view in the aa' direction, the contact layer 6 only exists on the sidewalls of the first source/drain electrode 51 and the second source/drain electrode 52, and there is no contact layer 6 at other positions. In the cross-sectional view in the bb' direction, there is no contact layer 6.

216) Etching the first insulating layer 9.

Figure 22A:
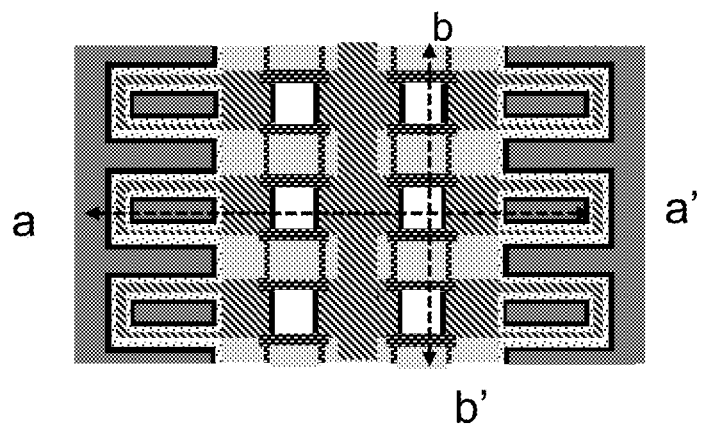
FIG. 22A is a cross-sectional view of a film layer on which the conductive layer is located in a direction parallel to the base substrate after a first insulating layer is etched according to an exemplary embodiment.
Figure 22B:
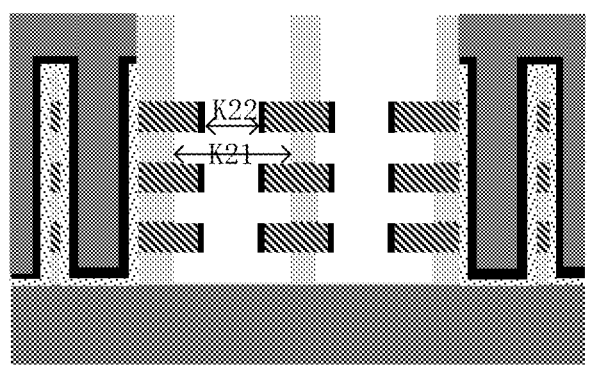
FIG. 22B is a cross-sectional view in the aa' direction in FIG. 22A.
Figure 22C:
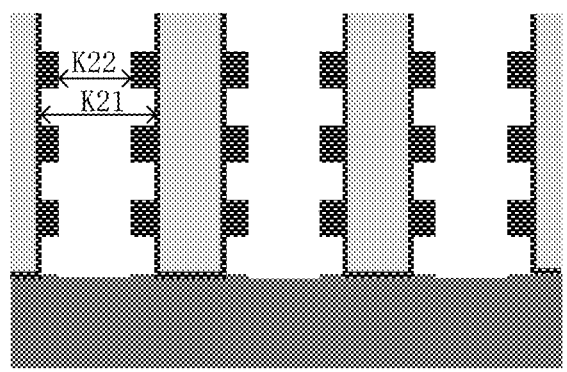
FIG. 22C is a cross-sectional view in the bb' direction in FIG. 22A.

Etching the first insulating layer 9 may include: performing wet transverse etching on the first insulating layer 9, such that an aperture of the second sub-hole K22, located on the conductive layer 12, of the second hole K2 is smaller than an aperture of the first sub-hole K21, located on the first insulating layer 9, of the second hole K2, so as to facilitate subsequent etching and removing of the semiconductor layer 23 between transistors outside the second hole K2 and eliminating parasitic transistors, as shown in FIGS. 22A, 22B and 22C, wherein, FIG. 22A is a cross-sectional view of the film layer where the conductive layer 12 is located in a direction parallel to the base substrate 1 after the first insulating layer 9 is etched, FIG. 22B is a cross-sectional view in the aa' direction in FIG. 22A, and FIG. 22C is a cross-sectional view in the bb' direction in FIG. 22A. In the bb' direction, the etching of the first insulating layer 9 stops at the barrier layer 7, so that a size of the second hole K2 in the bb' direction may be defined by the barrier layer 7, and accurate control to the second hole K2 can be achieved.

In some embodiments, a first width of the first insulating layer 9 transversely etched in a direction parallel to the aa' direction may be greater than a second width of the first insulating layer 9 transversely etched in a direction parallel to the bb' direction, i.e., more etching amount in the direction parallel to the aa' direction, less etching amount in the direction parallel to the bb' direction. More etching amount is in the aa' direction, so when the semiconductor layer 23 needs to be exposed later, less first insulating layer 9 needs to be etched away, and the process is simpler. Less etching amount is in bb' direction is small, so the device size can be reduced, and the device density can be increased.

217) Forming the semiconductor layer 23, the gate insulating layer 24 and the word line 40.

Figure 23A:
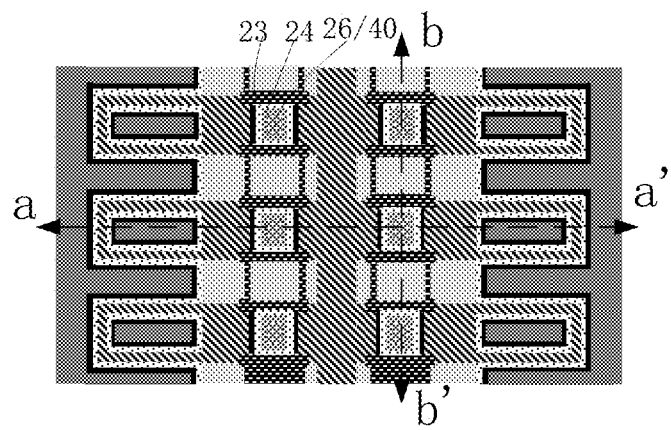
FIG. 23A is a cross-sectional view (a film layer on which the conductive layer is located) in a direction parallel to the base substrate after a semiconductor layer, a gate insulating layer, and a word line are formed according to an exemplary embodiment.
Figure 23B:
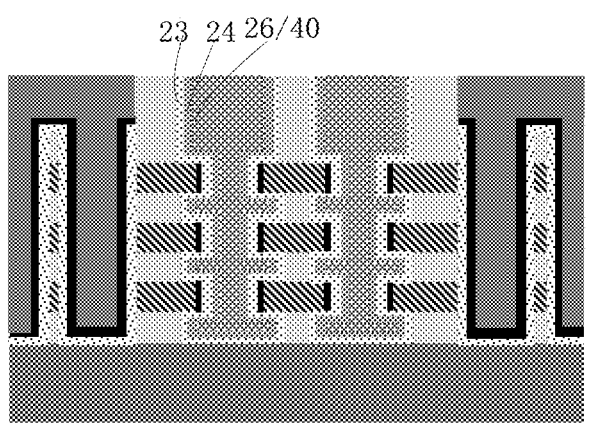
FIG. 23B is a cross-sectional view in the aa' direction in FIG. 23A.
Figure 23C:
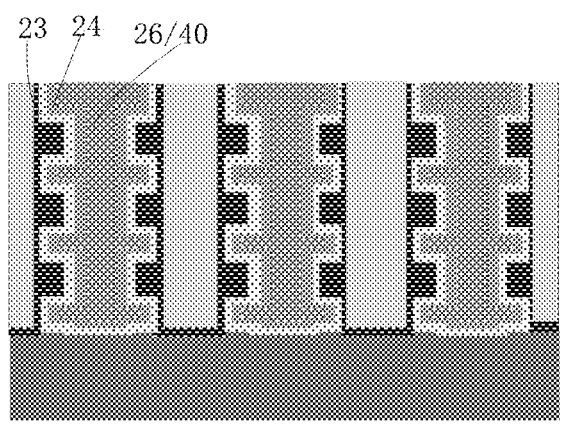
FIG. 23C is a cross-sectional view in the bb' direction in FIG. 23A.

Forming the semiconductor layer 23, the gate insulating layer 24, and the word line 40 may include: sequentially depositing a semiconductor thin film, a gate insulating thin film, and a gate electrode thin film on the base substrate 1 on which the aforementioned structures are formed, and grinding them to form the semiconductor layer 23, the gate insulating layer 24, and the word line 40; as shown in FIG. 23A, FIG. 23B, and FIG. 23C, wherein FIG. 23A is a cross-sectional view (the film layer where the conductive layer 12 is located) in a direction parallel to the base substrate 1 after the semiconductor layer 23, the gate insulating layer 24, and the word line 40 are formed, FIG. 23B is a cross-sectional view in the aa' direction in FIG. 23A, and FIG. 23C is a cross-sectional view in the bb' direction in FIG. 23A. The gate electrodes 26 of each layer of transistors are a part of the word line 40.

The semiconductor layer 23 may cover the bottom wall and the sidewall of the second hole K2, the word line 40 fills the second hole K2, and the gate insulating layer 24 is disposed between the semiconductor layer 23 and the word line 40 such that the semiconductor layer 23 and the word line 40 are insulated.

In some embodiments, the semiconductor thin film, the gate insulating thin film, and the gate electrode thin film may be deposited by ALD.

In the exemplary embodiment of the present disclosure, the material of the semiconductor layer 23, the material of the gate insulating layer 24, and the material of the word line 40 may be referred to the previous embodiment and will not be repeated in detail. In this embodiment, the contact layer 6 is provided between the semiconductor layer 23 and the first source/drain electrode 51, and the contact layer 6 is provided between the semiconductor layer 23 and the second source/drain electrode 52, so that the contact resistances between the semiconductor layer 23 and the first source/drain electrode 51 and between the semiconductor layer 23 and the second source/drain electrode 52 can be reduced.

218) Exposing a sidewall of the semiconductor layer 23 located in the first sub-hole K21 and connected to the barrier layer 7.

Figure 24A:
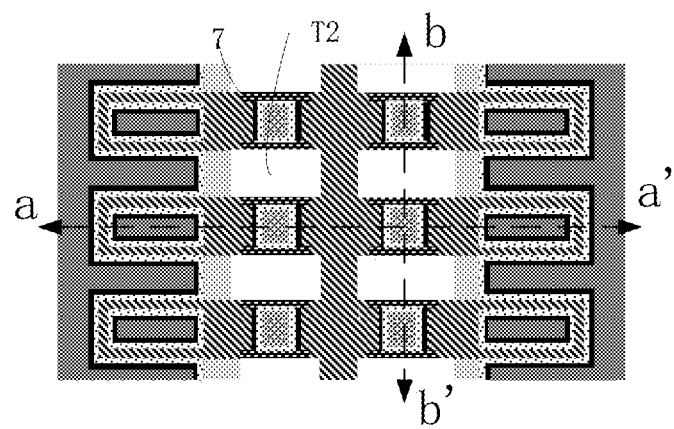
FIG. 24A is a cross-sectional view (a film layer on which the conductive layer is located) in a direction parallel to the base substrate after a semiconductor layer is exposed according to an exemplary embodiment.
Figure 24B:
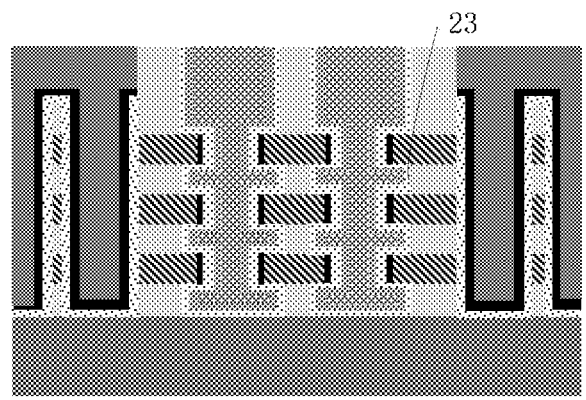
FIG. 24B is a cross-sectional view in the aa' direction in FIG. 24A.
Figure 24C:
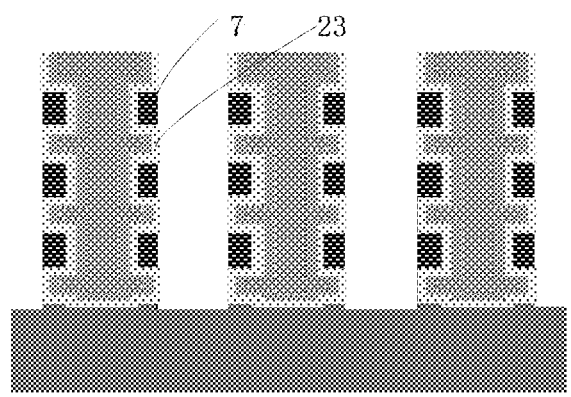
FIG. 24C is a cross-sectional view in the bb' direction in FIG. 24A.

Exposing the sidewall of the semiconductor layer 23 located in the first sub-hole K21 and connected to the barrier layer 7 may include: removing the fourth insulating layer 15 in the second trench T2 by dry etching, removing a part of the barrier layer 7 by dry etching, and exposing the sidewall of the semiconductor layer 23 connected to the barrier layer 7 and located in the first sub-hole K21 (after the barrier layer 7 is etched and removed, the exposed sidewall of the semiconductor layer 23 is not connected with the barrier layer 7), and the exposed sidewall of the semiconductor layer 23 is parallel to the extending direction of the first conductive part 121. In this case, the semiconductor layer 23 located in the second sub-hole K22 is protected by the barrier layer 7, as shown in FIGS. 24A, 24B and 24C, wherein, FIG. 24A is a cross-sectional view (the film layer where the conductive layer 12 is located) in a direction parallel to the base substrate 1 after the semiconductor layer 23 is exposed, and FIG. 24B is a cross-sectional view in the aa' direction in FIG. 24A, and FIG. 24C is a cross-sectional view in the bb' direction in FIG. 24A. In this case, the semiconductor layer 23 located in the first sub-hole K21 is only partially exposed, and two sidewalls are not exposed, as shown in FIG. 24B, the two sidewalls of the semiconductor layer 23 located in the first sub-hole 21 in the aa' direction are not exposed. In addition, the barrier layer 7 retains only the sidewalls parallel to the aa' direction, and the sidewalls perpendicular to the aa' direction are etched as shown in FIG. 24A.

219) Exposing a sidewall of the semiconductor layer 23 located in the first sub-hole K21 and connected to the first insulating layer 9.

Figure 25A:
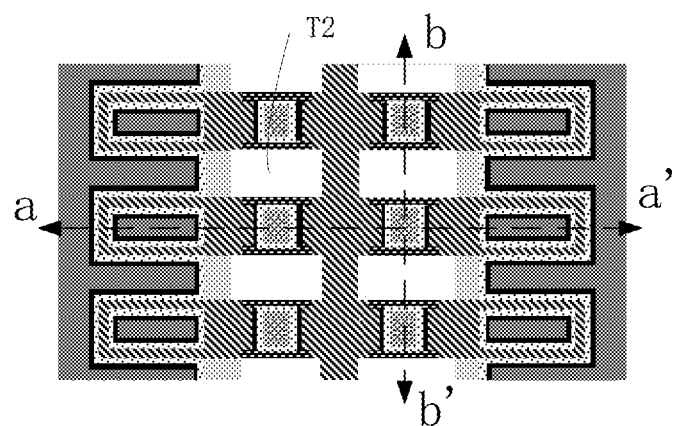
FIG. 25A is a cross-sectional view (a film layer on which the conductive layer 12 is located) in a direction parallel to the base substrate after a semiconductor layer is exposed according to an exemplary embodiment.
Figure 25B:
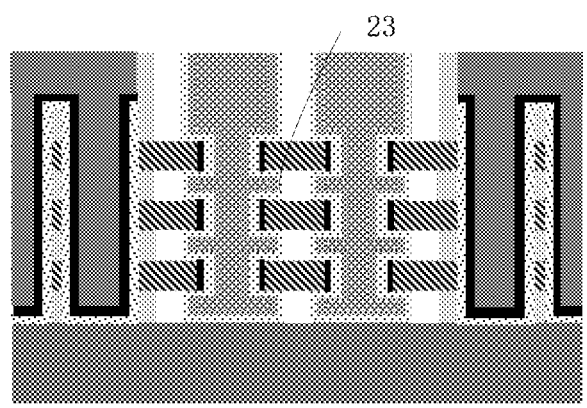
FIG. 25B is a cross-sectional view in the aa' direction in FIG. 25A.
Figure 25C:
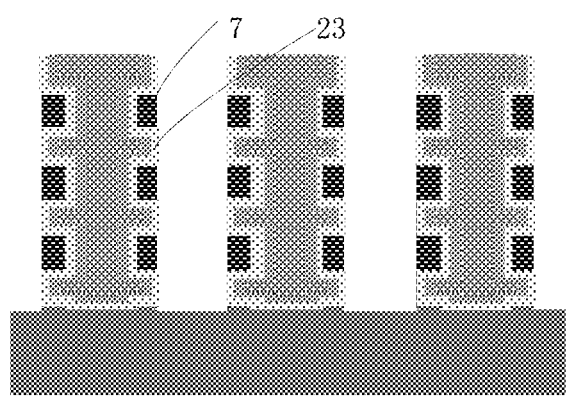
FIG. 25C is a cross-sectional view in the bb' direction in FIG. 25A.

Exposing the sidewall of the semiconductor layer 23 located in the first sub-hole K21 and connected to the first insulating layer 9 may include: wet etching the first insulating layer 9 through a second trench T2 (the fourth insulating layer 15 in the second trench T2 is removed in the previous act), exposing the sidewall of the semiconductor layer 23 located in the first sub-hole K21 and connected to the first insulating layer 9; as shown in FIGS. 25A, 25B and 25C, FIG. 25A is a cross-sectional view (the film layer where the conductive layer 12 is located) in a direction parallel to the base substrate 1 after the semiconductor layer 23 is exposed, FIG. 25B is a cross-sectional view in the aa' direction in FIG. 25A, and FIG. 25C is a cross-sectional view in the bb' direction in FIG. 25A. In this case, the semiconductor layers 23 located in the first sub-hole K21 are all exposed.

220) Etching and removing the semiconductor layer 23 located in the first sub-hole K21.

Etching and removing the semiconductor layer 23 located in the first sub-hole K21 may include: removing the semiconductor layer 23 located in the first sub-hole K21 by wet etching; wherein the semiconductor layers 23 of storage cells in different layers are disconnected.

A sixth insulating thin film is deposited on the base substrate 1 on which the aforementioned structures are formed and ground to form a sixth insulating layer 17; the sixth insulating layer 17 fills the second trench T2 and the first insulating layer 9, and the etched region of the semiconductor layer 23, as shown in FIGS. 26A, 26B and 26C, wherein, FIG. 26A is a cross-sectional view (the film layer where the conductive layer 12 is located) in a direction parallel to the base substrate after the semiconductor layer 23 is etched, FIG. 26B is a cross-sectional view in the aa' direction in FIG. 26A, and FIG. 26C is a cross-sectional view in the bb' direction in FIG. 26A.

According to the scheme provided by the embodiment, the contact resistances between the semiconductor layer and the electrodes of the transistor can be reduced by providing a contact layer between the semiconductor layer and the electrodes of the transistor (source electrode and/or drain electrode).

An embodiment of the present disclosure provides a method for manufacturing a semiconductor device. The semiconductor device includes: multiple transistors distributed in different layers and stacked along a direction perpendicular to a base substrate; a word line penetrating the different layers and extending in the direction perpendicular to the base substrate; multiple capacitors in one-to-one correspondence with the multiple transistors, and the capacitors are connected with the corresponding transistors; the capacitor includes a first electrode and a second electrode; the transistor includes a first source/drain electrode, a second source/drain electrode, and a semiconductor layer surrounding a sidewall of the word line, and the first source/drain electrode is connected to a first electrode of a corresponding capacitor.

The method for manufacturing the semiconductor device includes:

forming a stacked structure of alternately stacked first insulating layers and sacrificial layers on the base substrate;

patterning the stacked structure to form a bit line region extending in a second direction and multiple storage cell regions extending in a first direction and spaced in the second direction; between any two adjacent storage cell regions, there is a trench extending along the first direction and penetrating the stacked structure;

forming at least one first hole penetrating the stacked structure in the storage cell region and filling a dummy electrode in the first hole;

performing transverse etching in the trench between any two adjacent storage cell regions to remove each sacrificial layer to expose a dummy electrode of a corresponding region;

replacing a region where each sacrificial is removed is located with a conductive layer, so that the first insulating layer and the conductive layer are alternately stacked, and the conductive layer surrounds the dummy electrode;

removing the dummy electrode to expose the first hole, forming a dielectric layer of the capacitor on a sidewall of the first hole, and forming an inner electrode of the second electrode of the capacitor in the first hole formed with the dielectric layer; and forming a second hole in the storage cell region adjacent to the bit line region, and forming the semiconductor layer, the gate insulating layer and the word line of the transistor in the second hole.

By the stacking of the insulating layers and the sacrificial layers to replace the stacking of the insulating layers and the conductive layers, the scheme provided by the present embodiments facilitates etching of the multi-layer structure with a high aspect ratio, reduces process difficulty and cost. In addition, by arranging the second electrode in the first hole, the area occupied by the capacitor can be reduced, thereby reducing the area of the semiconductor device and increasing the density of the semiconductor device.

In some embodiments, the first hole and the second hole may be formed by one patterning process. Compared with the semiconductor device without the first hole, the scheme provided by the embodiments of the present disclosure does not need to add an additional process for the first hole, avoids the multiple etchings of the stacked structure, and reduces the cost. However, embodiments of the present disclosure are not limited thereto, and the first hole and the second hole may be respectively formed by multiple patterning processes.

In some embodiments, replacing the region where each sacrificial layer removed is located with a conductive layer includes:

depositing a conductive thin film, wherein the conductive thin film fills the region where the sacrificial layer is located and the trench;

removing the conductive thin film in the trench by dry etching to form the conductive layer;

or, depositing a conductive thin film, which fills the region on which the sacrificial layer is located and covers the sidewall and the bottom wall of the trench; and removing the conductive thin film in the trench by wet etching to form the conductive layer.

In some embodiments, the conductive layer includes a first electrode of the capacitor, and the method further includes: exposing an outer wall of the first electrode, wherein the outer wall includes an end face of the first electrode away from the bit line region and two sidewalls adjacent to the end face, the end face and the two sidewalls both extend in the direction perpendicular to the base substrate, forming an outer electrode of the second electrode surrounding the end face and the two sidewalls of the first electrode, and forming a dielectric layer disposed between the outer wall of the first electrode and the outer electrode. In the scheme provided by the present embodiment, the capacitor may include an outer electrode and an inner electrode, compared with the scheme in which only the outer electrode are included, the electrode area of the capacitor can be increased, the capacitance can be increased, and the area occupied by the capacitor does not need to be additionally increased.

An embodiment of the present disclosure provides an electronic device including the semiconductor device described in any of the above embodiments, or the semiconductor device manufactured by the method for manufacturing the semiconductor device described in any of the above embodiments. The electronic device may be a storage device, a smart phone, a computer, a tablet computer, an artificial intelligence device, a wearable device or a mobile power supply, etc. The storage device may include a memory in a computer or the like, which is not limited here.

Although implementations disclosed in the present disclosure are as the above, the described contents are only implementations used for facilitating understanding the present disclosure, and are not intended to limit the present disclosure. Any person skilled in the art to which the present disclosure pertains may make any modification and variation in the form and details of implementations without departing from the spirit and the scope disclosed in the present disclosure. Nevertheless, the scope of patent protection of the present disclosure shall still be subject to the scope defined by the appended claims.

What is claimed is:

1. A semiconductor device, comprising: a plurality of storage cells stacked in a direction perpendicular to a base substrate, wherein the plurality of storage cells comprise:
    a plurality of transistors, distributed in different layers and stacked along the direction perpendicular to the base substrate;
    a word line, penetrating the different layers and extending in the direction perpendicular to the base substrate;
    a plurality of capacitors, connected with the plurality of transistors in a one-to-one correspondence; wherein a capacitor comprises a first electrode and a second electrode; a transistor comprises a first source/drain electrode, a second source/drain electrode, and a semiconductor layer surrounding a sidewall of the word line; the first source/drain electrode is connected with a first electrode of a corresponding capacitor;
    first insulating layers and conductive layers, alternately distributed in the direction perpendicular to the base substrate, wherein each of the conductive layers comprises the first source/drain electrode, the second source/drain electrode and the first electrode;
    wherein a region of the first electrode comprises at least one first hole penetrating each of the first insulating layers and each of the conductive layers, and further comprises a second hole penetrating the first insulating layers and the conductive layers; the word line is disposed in the second hole; an orthographic projection of a second sub-hole, located on the conductive layer, of the second hole on the base substrate falls into an orthographic projection of a first sub-hole, located on the first insulating layer, of the second hole on the base substrate; the second electrode comprises an inner electrode disposed in the first hole and insulated from each first electrode;
    the semiconductor layer comprises a first groove of which opening is towards the first source/drain electrode, the first source/drain electrode fills the first groove.

2. The semiconductor device according to claim 1, wherein the second electrode further comprises: an outer electrode, the first electrode comprises a first end face away from the first source/drain electrode and two first sidewalls adjacent to the first end face, and the outer electrode surrounds a first end face and two first sidewalls of each first electrode.

3. The semiconductor device according to claim 2, wherein the inner electrode comprises a first connection electrode filled in the first hole, and a first sub-electrode distributed on the inner wall of the first hole between the first connection electrode and the first electrode.

4. The semiconductor device according to claim 3, wherein a plurality of first sub-electrodes of the plurality of capacitors are an integrated annular electrode, and a plurality of first connection electrodes of the plurality of capacitors are an integrated linear electrode.

5. The semiconductor device according to claim 4, wherein the outer electrode comprises a second sub-electrode extending along an outer sidewall of the first electrode, and a second connection electrode located on a side of the second sub-electrode away from the first electrode;
    a plurality of second sub-electrodes of the plurality of capacitors are an integrated structure, and a plurality of connection electrodes of the plurality of capacitors are an integrated structure.

6. The semiconductor device according to claim 5, wherein the first sub-electrode and the second sub-electrode are connected only at top of the plurality of storage cells stacked to form the integrated structure, and the first connection electrode and the second connection electrode are connected only at the top of the plurality of storage cells stacked to form the integrated structure.

7. The semiconductor device according to claim 6, wherein the semiconductor device comprises a plurality of layers of storage cells, each layer of storage cells comprise a storage cell array comprising a plurality of rows and columns of storage cells, and second connection electrodes of a plurality of stacked storage cells in a same column and different layers are connected to form an integrated structure; and second sub-electrodes of a plurality of stacked storage cells in a same column and in different layers are connected to form an integrated structure.

8. The semiconductor device according to claim 7, wherein the second connection electrode having the integrated structure comprises a first portion in a trench between two adjacent storage cells in a row direction, and a second portion extending into a trench between two adjacent storage cells in a column direction.

9. The semiconductor device according to claim 1, wherein the first electrode and the first source/drain electrode are an integrated structure extending in a direction parallel to the base substrate.

10. The semiconductor device according to claim 9, wherein an integrated structure formed by the first electrode of the capacitor and the first source/drain electrode extends in a first direction away from the second source/drain electrode, the region of the first electrode comprises a plurality of first holes, and the plurality of first holes are arranged in the first direction, and inner electrodes in the plurality of first holes are electrically connected.

11. The semiconductor device according to claim 1, wherein the semiconductor layer further includes a third groove of which opening is away from the word line, and the semiconductor layer further includes a barrier layer that fills the third groove.

12. The semiconductor device according to claim 1, wherein the semiconductor device further comprises: a second hole penetrating each of the first insulating layers and each of the conductive layers; the word line is disposed in the second hole; the first electrode, the first source/drain electrode, the second source/drain electrode are disposed in a same layer; and the first source/drain electrode, the second source/drain electrode are disconnected at the second hole.

13. A method for manufacturing the semiconductor device according to claim 1, the method comprising:
- forming a stacked structure of alternately stacked first insulating layers and sacrificial layers on the base substrate;
- patterning the stacked structure to form a bit line region extending in a second direction and a plurality of storage cell regions extending in a first direction and spaced in the second direction; wherein between any two adjacent storage cell regions, there is a trench extending along the first direction and penetrating the stacked structure;
- forming at least one first hole penetrating the stacked structure in the storage cell region and filling a dummy electrode in the first hole, wherein the first hole is not communicated with the trench;
- performing transverse etching in the trench between any two adjacent storage cell regions to remove each sacrificial layer to expose a dummy electrode of a corresponding region;
- replacing a region where each sacrificial layer removed is located with a conductive layer, to enable the first insulating layers and conductive layers to be alternately stacked, and the conductive layers to surround the dummy electrode; and
- removing the dummy electrode to expose the first hole, forming a dielectric layer of the capacitor on the sidewall of the first hole, and forming an inner electrode of the second electrode of the capacitor in the first hole formed with the dielectric layer.

14. The method according to claim 13, further comprising: forming a second hole in the storage cell region adjacent to the bit line region, and forming the semiconductor layer, a gate insulating layer and the word line of the transistor in the second hole;
wherein the first hole and the second hole are formed by one patterning process.

15. The method according to claim 13, wherein replacing the region where each sacrificial layer removed is located with the conductive layer comprises:
- depositing a conductive thin film, wherein the conductive thin film fills the region where the sacrificial layer is located and the trench;
- removing the conductive thin film in the trench by dry etching and forming the conductive layer;
- or, depositing a conductive thin film, which fills the region where the sacrificial layer is located and covers a sidewall and a bottom wall of the trench; and
- removing the conductive thin film in the trench by wet etching and forming the conductive layer.

16. The method according to claim 13, wherein the conductive layer comprises a first electrode of the capacitor, and the method further comprises: exposing an outer wall of the first electrode, wherein the outer wall comprises an end face of the first electrode away from the bit line region and two sidewalls adjacent to the end face, the end face and the two sidewalls both extend in the direction perpendicular to the base substrate, forming an outer electrode of the second electrode surrounding the end face and the two sidewalls of the first electrode, and forming a dielectric layer disposed between the outer wall of the first electrode and the outer electrode.

17. The method according to claim 14, wherein the forming the second hole in the storage cell region adjacent to the bit line region, and forming the semiconductor layer, the gate insulating layer and the word line of the transistor in the second hole comprises:
- forming the second hole penetrating the stacked structure in the storage cell region adjacent to the bit line region and filling a dummy electrode in the second hole;
- etching the stacked structure, forming a second trench penetrating the stacked structure between adjacent storage cell regions, wherein the second trench exposes a sidewall of the conductive layer parallel to the first direction and facing the second trench and close to the second hole; transversely etching the conductive layer based on the second trench to expose a sidewall of the dummy electrode facing the trench, and enabling the conductive layer to form a first source/drain electrode and a second source/drain electrode disconnected from each other;
- depositing a barrier layer film in the second trench to form a barrier layer covering a bottom wall and sidewalls of the second trench;
- etching to remove the dummy electrode located in the second hole;
- transversely etching the first insulating layer without etching the barrier layer, so that on a plane parallel to the base substrate, an orthographic projection of a second sub-hole of the second hole located in the conductive layer on the base substrate falls into an orthographic projection of a first sub-hole of the second hole located in the first insulating layer on the base substrate; and depositing a semiconductor film, a gate insulating film and a gate electrode film sequentially in the second hole to form semiconductor layers, gate insulating layers and a word line of transistors in a plurality of layers, wherein the word line fills the second hole.

18. The method according to claim 17, wherein after forming the semiconductor layers, gate insulating layers, and word line of the transistors in the plurality of layers, the method further comprises:

etching the barrier layer to expose a sidewall of a semiconductor layer located in the first sub-hole and connected to the barrier layer, and not to expose a sidewall of a semiconductor layer located in the second sub-hole; and transversely etching the first insulating layer to expose a sidewall of a semiconductor layer connected to the first insulating layer within the first sub-hole; and etching to remove the semiconductor layer located in the first sub-hole.

19. The method according to claim 18, wherein after etching to remove the dummy electrode located in the second hole, before transversely etching the first insulating layer without etching the barrier layer, the method further comprises:

transversely etching the conductive layer by a preset width in the first direction, so that an aperture of the second sub-hole is enlarged in the first direction;

depositing a conductive film in the second hole to form a contact layer; etching the contact layer, and only retaining a contact layer provided on a sidewall of the conductive layer.

20. An electronic device, comprising the semiconductor device according to claim 1.

* * * * *